(12) United States Patent
Wu

(10) Patent No.: US 12,009,768 B2
(45) Date of Patent: Jun. 11, 2024

(54) INTERFACE CIRCUIT OF VEHICLE-MOUNTED CONTROL UNIT, APPARATUS, VEHICLE, AND CONTROL METHOD

(71) Applicant: HUAWEI TECHNOLOGIES CO., LTD., Guangdong (CN)

(72) Inventor: Zixu Wu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 182 days.

(21) Appl. No.: 17/863,654

(22) Filed: Jul. 13, 2022

(65) Prior Publication Data

US 2022/0345058 A1    Oct. 27, 2022

Related U.S. Application Data

(63) Continuation of application No. PCT/CN2020/081650, filed on Mar. 27, 2020.

(51) Int. Cl.
*H02P 3/00* (2006.01)
*B60R 16/023* (2006.01)
*G06F 13/40* (2006.01)
*H02P 5/00* (2016.01)
*H02P 5/46* (2006.01)
(Continued)

(52) U.S. Cl.
CPC ............ *H02P 7/04* (2016.02); *B60R 16/0238* (2013.01); *G06F 13/4068* (2013.01); *H02P 6/085* (2013.01); *H03K 19/01721* (2013.01); *H04L 25/4902* (2013.01); *H04L 12/40* (2013.01); *H04L 2012/40215* (2013.01); *H04L 2012/40273* (2013.01)

(58) Field of Classification Search
CPC ........ H02P 7/04; H02P 6/085; B60R 16/0238; G06F 13/4068; H03K 19/01721
USPC .......................................................... 318/86
See application file for complete search history.

(56) References Cited

U.S. PATENT DOCUMENTS

2006/0224776 A1    10/2006    Vanderhenst
2009/0038944 A1    2/2009    Kruger
(Continued)

FOREIGN PATENT DOCUMENTS

CN    102822502 A    12/2012
CN    104216311 A    12/2014
(Continued)

OTHER PUBLICATIONS

Wang, "Design of Body Control Module in Vehicle Based on CAN/LIN Bus," Thesis for the Master degree of Engineering, Hunan University, School of Control Science and Engineering, Apr. 25, 2011, 84 pages (with English abstract).

(Continued)

*Primary Examiner* — Erick D Glass
(74) *Attorney, Agent, or Firm* — Fish & Richardson P.C.

(57) ABSTRACT

This application provides an interface circuit of a vehicle-mounted control unit comprising an H-bridge circuit, an input branch, and a pull-up network. An input end of the H-bridge circuit is connected to a controller 240, and an output end of the H-bridge circuit is connected to an interface port IO of the interface circuit. A first end of the input branch is connected to the interface port IO, and a second end of the input branch is connected to the controller.

20 Claims, 10 Drawing Sheets

(51) Int. Cl.
  *H02P 6/08* (2016.01)
  *H02P 7/03* (2016.01)
  *H03K 19/017* (2006.01)
  *H04L 25/49* (2006.01)
  *H04L 12/40* (2006.01)

(56) References Cited

U.S. PATENT DOCUMENTS

| | | | |
|---|---|---|---|
| 2014/0334044 A1 | 11/2014 | Horihata et al. | |
| 2018/0173666 A1* | 6/2018 | Srivastava | G06F 13/4027 |
| 2018/0236974 A1* | 8/2018 | Kubb | B60T 17/22 |
| 2019/0250610 A1 | 8/2019 | Luo | |

FOREIGN PATENT DOCUMENTS

| | | |
|---|---|---|
| CN | 104423290 A | 3/2015 |
| CN | 108146188 A | 6/2018 |
| CN | 108304344 A | 7/2018 |
| CN | 110874917 A | 3/2020 |
| EP | 1610384 A2 | 12/2005 |

OTHER PUBLICATIONS

Chen, "Design of General Motors ECU Development Platform", Thesis for the Master degree, Nanjing University of Science and Technology, Mar. 22, 2017, 95 pages (with English abstract).

Qiu, "Structural Theory of Network on Vehicle and Its Study on Diagnosis Technology," Thesis for the Master degree, Chang'an University, Jan. 12, 2007, 127 pages (with English abstract).

Office Action in Chinese Appln. No. 202080004584.3, dated Jul. 26, 2021, 7 pages (with English translation).

Extended European Search Report in European Appln No. 20927217.8, dated Nov. 14, 2022, 6 pages.

International Search Report and Written Opinion in International Appln. No. PCT/CN2020/081650, mailed on Nov. 26, 2020, 20 pages (with English translation).

* cited by examiner

INTERFACE CIRCUIT OF VEHICLE-MOUNTED CONTROL UNIT, APPARATUS, VEHICLE, AND CONTROL METHOD

CROSS-REFERENCE TO RELATED APPLICATIONS

This application is a continuation of International Application No. PCT/CN2020/081650, filed on Mar. 27, 2020, the disclosure of which is hereby incorporated by reference in its entirety.

TECHNICAL FIELD

This application relates to the field of automobile technologies, and more specifically, to an interface circuit of a vehicle-mounted control unit, an apparatus, a vehicle, and a control method.

BACKGROUND

A vehicle-mounted control unit is an important component for managing and controlling a vehicle-mounted electronic device. To meet connection requirements of different vehicle-mounted electronic devices in a vehicle, the vehicle-mounted control unit is usually provided with dedicated interfaces such as a digital input interface, a digital output interface, a local interconnect network (LIN) bus interface, a single edge nibble transmission (SENT) bus interface, and an H-bridge output interface. However, as types of vehicle-mounted electronic devices increase, it is highly possible that interfaces of one type are insufficient while interfaces of another type are remaining in the vehicle-mounted control unit during actual application. As a result, requirement pressure on the interfaces of the type is high, and resource utilization of the interfaces of the another type is low.

SUMMARY

This application provides an interface circuit of a vehicle-mounted control unit, a vehicle-mounted control unit, a vehicle, and a control method, to implement a configurable multi-functional interface circuit, and reduce requirement pressure of diversified vehicle-mounted electronic devices on diversified interfaces of the vehicle-mounted control unit.

According to a first aspect, an interface circuit of a vehicle-mounted control unit is provided. The interface circuit includes an H-bridge circuit 210, an input branch 220, and a pull-up network 230. An input end 211 of the H-bridge circuit 210 is connected to a controller 240, and an output end 212 of the H-bridge circuit 210 is connected to an interface port IO of the interface circuit. A first end of the input branch 220 is connected to the interface port IO, and a second end of the input branch 220 is connected to the controller 240. The pull-up network 230 includes a local interconnect network (LIN) bus pull-up resistor branch 231 and/or a single edge nibble transmission (SENT) bus pull-up resistor branch 232. The LIN bus pull-up resistor branch 231 is provided with a LIN bus pull-up resistor 2311, a diode 2312, and a first switch component 2313. A first end of the LIN bus pull-up resistor 2311 is connected to a LIN bus power supply 233, a second end of the LIN bus pull-up resistor 2311 is connected to an anode of the diode 2312, and a cathode of the diode 2312 is connected to the interface port IO by using the first switch component 2313. The SENT bus pull-up resistor branch 232 is provided with a SENT bus pull-up resistor 2321 and a second switch component 2322. A first end of the SENT bus pull-up resistor 2321 is connected to a SENT bus power supply 234, and a second end of the SENT bus pull-up resistor 2321 is connected to the interface port IO by using the second switch component 2322. On-off of the first switch component 2313 is controlled by the controller 240 by using a first control branch 235 and/or on-off of the second switch component 2322 is controlled by the controller 240 by using a second control branch 236. The interface circuit is configured as one or more of the following interfaces under the control of the controller 240: an H-bridge output interface, a 12 V power output interface, a 5 V digital signal output interface, a 5 V digital signal input interface, a 12 V digital signal input interface, a LIN bus interface, and/or a SENT bus interface.

The interface circuit provided in this embodiment of this application is a configurable multi-functional interface circuit, and can be configured as a plurality of different types of interfaces under the control of the controller 240, so that the interface circuit is applicable to more types of vehicle-mounted electronic devices. This can reduce requirement pressure of diversified vehicle-mounted electronic devices on diversified interfaces of the vehicle-mounted control unit.

In a possible implementation, the H-bridge circuit 210 is a full-bridge circuit or includes two half-bridge circuits. The output end 212 of the H-bridge circuit 210 includes a first output end and a second output end. The interface port IO includes a first interface port and a second interface port. The first interface port is connected to the first output end, and the second interface port is connected to the second output end.

In this embodiment of this application, two interface ports IO are set to implement positive rotation and reversal rotation of a motor when the interface ports IO are externally connected to the direct-current brush motor. When some other vehicle-mounted electronic devices are externally connected, the two interface ports may work independently. For example, one of the interface ports may be connected to a vehicle-mounted electronic device, or the two interface ports may be separately connected to two vehicle-mounted devices. The two interface ports may also cooperate with each other for use. For example, one interface port is used to provide a power supply voltage for the vehicle-mounted electronic device, and the other interface port is used to communicate with the vehicle-mounted electronic device. This improves resource utilization.

In a possible implementation, the input branch 220 includes a first input branch and a second input branch, and the first input branch and the second input branch are connected to the first interface port and the second interface port respectively.

In this embodiment of this application, two input branches 220 are set to configure two independent digital signal input interfaces.

In a possible implementation, the LIN bus pull-up resistor branch 231 includes a first LIN bus pull-up resistor branch and a second LIN bus pull-up resistor branch that are connected in parallel. The LIN bus pull-up resistor 2311 includes a first pull-up resistor R1 and a second pull-up resistor R2. The diode 2312 disposed on the LIN bus pull-up resistor branch 231 includes a first diode D1 and a second diode D2. The first switch component 2313 disposed on the LIN bus pull-up resistor branch 231 includes a third switch component S1 and a fourth switch component S2. The first LIN bus pull-up resistor branch includes the first pull-up resistor R1, the first diode D1, and the third switch component S1. A first end of the first pull-up resistor R1 is connected to the LIN bus power supply 233, a second end of the first pull-up resistor R1 is connected to an anode of the diode D1, and a cathode of the diode D1 is connected to the first interface port by using the third switch component S1. The second LIN bus pull-up resistor branch includes the second pull-up resistor R2, the second diode D2, and the fourth switch component S2. A first end of the second pull-up resistor R2 is connected to the LIN bus power supply 233, a second end of the second pull-up resistor R2 is connected to an anode of the diode D2, and a cathode of the diode D2 is connected to the second interface port by using the first switch component S2. The first control branch 235 includes a third control branch K1 and a fourth control branch K2. The controller 240 controls on-off of the third switch component S1 and the fourth switch component S2 by using the third control branch K1 and the fourth control branch K2 respectively.

In this embodiment of this application, two LIN bus pull-up resistor branches are set to configure two independent LIN bus interfaces.

In a possible implementation, the SENT bus pull-up resistor branch 232 includes a first SENT bus pull-up resistor branch and a second SENT bus pull-up resistor branch that are connected in parallel. The SENT bus pull-up resistor 2321 includes a third pull-up resistor R3 and a fourth pull-up resistor R4. The second switch component 2322 disposed on the SENT bus pull-up resistor branch 232 includes a fifth switch component S3 and a sixth switch component S4. The first SENT bus pull-up resistor branch includes the third pull-up resistor R3 and the fifth switch component S3. A first end of the third pull-up resistor R3 is connected to the SENT bus power supply 234, and a second end of the third pull-up resistor R3 is connected to the first interface port by using the fifth switch component S3. The second SENT bus pull-up resistor branch includes the fourth pull-up resistor R4 and the sixth switch component S4. A first end of the fourth pull-up resistor R4 is connected to the SENT bus power supply 234, and a second end of the fourth pull-up resistor R4 is connected to the second interface port by using the sixth switch component S4. The second control branch 236 includes a fifth control branch K3 and a sixth control branch K4. The controller 240 controls on-off of the fifth switch component S3 and the sixth switch component S4 by using the fifth control branch K3 and the sixth control branch K4 respectively.

In this embodiment of this application, two SENT bus pull-up resistor branches are set to configure two independent SENT bus interfaces.

In a possible implementation, when the interface circuit is configured as the H-bridge output interface, the interface circuit is controlled by the controller 240 to output a control signal of a direct-current brush motor in the H-bridge circuit 210.

In this embodiment of this application, the interface circuit may be configured as one H-full-bridge output interface, or may be configured as two H-half-bridge output interfaces.

In a possible implementation, when the interface circuit is configured as the 12 V power output interface, the interface circuit is controlled by the controller 240 to output a high-side output in the H-bridge circuit 210.

In this embodiment of this application, the interface circuit may be configured as two 12 V power output interfaces.

In a possible implementation, when the interface is configured as the 5 V digital signal output interface, the interface circuit is controlled by the controller 240 to output a low-side output in the H-bridge circuit 210.

In this embodiment of this application, the interface circuit may be configured as two 5 V digital signal output interfaces.

In a possible implementation, the H-bridge circuit 210 is an H-bridge circuit with a high-impedance output.

In this embodiment of this application, the H-bridge circuit with a high-impedance output is used, so that the interface port IO can have an input function.

In a possible implementation, when the interface circuit is configured as the 5 V digital signal input interface, the interface circuit is controlled by the controller 240 to output a high-impedance output in the H-bridge circuit 210 and collect a signal of the interface port IO by using the input branch 220.

In this embodiment of this application, the interface circuit may be configured as two 5 V digital signal input interfaces.

In a possible implementation, when the interface circuit is configured as the 12 V digital signal input interface, the interface circuit is controlled by the controller 240 to output a high-impedance output in the H-bridge circuit 210 and collect a signal of the interface port IO by using the input branch 220.

In this embodiment of this application, the interface circuit may be configured as two 12 V digital signal input interfaces.

In a possible implementation, when the interface circuit is configured as the LIN bus interface, the interface circuit is controlled by the controller 240 to turn on the first switch component 2313, and the H-bridge circuit 210 is controlled to output a low-side output based on LIN bus timing or output a high-impedance output based on LIN bus timing.

In this embodiment of this application, the interface circuit may be configured as two LIN bus interfaces.

In a possible implementation, when the interface circuit is configured as the SENT bus interface, the interface circuit is controlled by the controller 240 to turn on the second switch component 2322, and the H-bridge circuit 210 is controlled to output a high-impedance output based on SENT bus timing.

In this embodiment of this application, the interface circuit may be configured as two SENT bus interfaces.

In a possible implementation, when the interface circuit is configured as the two output ends cooperating with each other to work, the interface circuit is controlled by the controller 240 to generate a power supply voltage for a vehicle-mounted electronic device at the first output end of the H-bridge circuit 210 and perform communication at the second output end through the following interface: a LIN bus interface, a SENT bus interface, a 12 V power output interface, a 5 V digital signal input interface, a 5 V digital signal output interface, or a 12 V digital signal input interface.

In a possible implementation, a power supply of the H-bridge circuit 210 is 12 V, the LIN bus power supply is 12 V, and/or the SENT bus power supply is 5 V.

In this embodiment of this application, the 12 V power supply is used for the H-bridge circuit 210, the 12 V power supply is used for the LIN bus, and the 5 V power supply is used for the SENT bus, so that the interface circuit can be used in a vehicle.

In a possible implementation, the H-bridge circuit 210 and a LIN bus share one power supply.

In this embodiment of this application, the H-bridge circuit 210 and LIN bus may share a 12 V power supply, so that a resource is fully utilized.

In this embodiment of this application, the controller is a micro control unit (MCU).

According to a second aspect, a vehicle-mounted control unit is provided, including one or more interface circuits according to the first aspect.

In a possible implementation, the vehicle-mounted control unit is an electronic control unit (ECU).

According to a third aspect, a vehicle is provided, including one or more vehicle-mounted control units according to the second aspect.

According to a fourth aspect, a control method for an interface circuit is provided. The interface circuit includes: an H-bridge circuit 210, an input branch 220, and a pull-up network 230. An input end 211 of the H-bridge circuit 210 is connected to a controller 240, and an output end 212 of the H-bridge circuit 210 is connected to an interface port IO of the interface circuit. A first end of the input branch 220 is connected to the interface port IO, and a second end of the input branch is connected to the controller 240. The pull-up network 230 includes a local interconnect network (LIN) bus pull-up resistor branch 231 and/or a single edge nibble transmission (SENT) bus pull-up resistor branch 232. The LIN bus pull-up resistor branch 231 is provided with a LIN bus pull-up resistor 2311, a diode 2312, and a first switch component 2313. A first end of the LIN bus pull-up resistor 2311 is connected to a LIN bus power supply 233, a second end of the LIN bus pull-up resistor 2311 is connected to an anode of the diode 2312, and a cathode of the diode 2312 is connected to the interface port IO by using the first switch component 2313. The SENT bus pull-up resistor branch 232 is provided with a SENT bus pull-up resistor 2321 and a second switch component 2322. A first end of the SENT bus pull-up resistor 2321 is connected to a SENT bus power supply 234, a second end of the SENT bus pull-up resistor 2321 is connected to the interface port IO by using the second switch component 2322. On-off of the first switch component 2313 is controlled by the controller 240 by using a first control branch 235 and/or on-off of the second switch component 2322 is controlled by the controller 240 by using a second control branch 236. The control method includes: The controller 240 controls to configure the interface circuit as one or more of the following interfaces: an H-bridge output interface, a 12 V power output interface, a 5 V digital signal output interface, a 5 V digital signal input interface, a 12 V digital signal input interface, a LIN bus interface, and/or a SENT bus interface.

In a possible implementation, the H-bridge circuit 210 is a full-bridge circuit or includes two half-bridge circuits. The output end 212 of the H-bridge circuit 210 includes a first output end and a second output end. The interface port IO includes a first interface port and a second interface port. The first interface port is connected to the first output end, and the second interface port is connected to the second output end.

In a possible implementation, the input branch 220 includes a first input branch and a second input branch, and the first input branch and the second input branch are connected to the first interface port and the second interface port respectively.

In a possible implementation, the LIN bus pull-up resistor branch 231 includes a first LIN bus pull-up resistor branch and a second LIN bus pull-up resistor branch that are connected in parallel. The LIN bus pull-up resistor 2311 includes a first pull-up resistor R1 and a second pull-up resistor R2. The diode 2312 disposed on the LIN bus pull-up resistor branch 231 includes a first diode D1 and a second diode D2. The first switch component 2313 disposed on the LIN bus pull-up resistor branch 231 includes a third switch component S1 and a fourth switch component S2. The first LIN bus pull-up resistor branch includes the first pull-up resistor R1, the first diode D1, and the third switch component S1. A first end of the first pull-up resistor R1 is connected to the LIN bus power supply 233, a second end of the first pull-up resistor R1 is connected to an anode of the diode D1, and a cathode of the diode D1 is connected to the first interface port by using the third switch component S1. The second LIN bus pull-up resistor branch includes the second pull-up resistor R2, the second diode D2, and the fourth switch component S2. A first end of the second pull-up resistor R2 is connected to the LIN bus power supply 233, a second end of the second pull-up resistor R2 is connected to an anode of the diode D2, and a cathode of the diode D2 is connected to the second interface port by using the first switch component S2. The first control branch 235 includes a third control branch K1 and a fourth control branch K2. The controller 240 controls on-off of the third switch component S1 and the fourth switch component S2 by using the third control branch K1 and the fourth control branch K2 respectively.

In a possible implementation, the SENT bus pull-up resistor branch 232 includes a first SENT bus pull-up resistor branch and a second SENT bus pull-up resistor branch that are connected in parallel. The SENT bus pull-up resistor 2321 includes a third pull-up resistor R3 and a fourth pull-up resistor R4. The second switch component 2322 disposed on the SENT bus pull-up resistor branch 232 includes a fifth switch component S3 and a sixth switch component S4. The first SENT bus pull-up resistor branch includes the third pull-up resistor R3 and the fifth switch component S3. A first end of the third pull-up resistor R3 is connected to the SENT bus power supply 234, and a second end of the third pull-up resistor R3 is connected to the first interface port by using the fifth switch component S3. The second SENT bus pull-up resistor branch includes the fourth pull-up resistor R4 and the sixth switch component S4. A first end of the fourth pull-up resistor R4 is connected to the SENT bus power supply 234, and a second end of the fourth pull-up resistor R4 is connected to the second interface port by using the sixth switch component S4. The second control branch 236 includes a fifth control branch K3 and a sixth control branch K4. The controller 240 controls on-off of the fifth switch component S3 and the sixth switch component S4 by using the fifth control branch K3 and the sixth control branch K4 respectively.

In a possible implementation, when the interface circuit is configured as the H-bridge output interface, the controller 240 controls the interface circuit to output a control signal of a direct-current brush motor in the H-bridge circuit 210.

In a possible implementation, when the interface circuit is configured as the 12 V power output interface, the controller 240 controls the interface circuit to output a high-side output in the H-bridge circuit 210.

In a possible implementation, when the interface is configured as the 5 V digital signal output interface, the controller 240 controls the interface circuit to output a low-side output in the H-bridge circuit 210.

In a possible implementation, the H-bridge circuit 210 is an H-bridge circuit with a high-impedance output.

In a possible implementation, when the interface circuit is configured as the 5 V digital signal input interface, the controller 240 controls the interface circuit to output a high-impedance output in the H-bridge circuit 210 and collect a signal of the interface port IO by using the input branch 220.

In a possible implementation, when the interface circuit is configured as the 12 V digital signal input interface, the controller 240 controls the interface circuit to output a high-impedance output in the H-bridge circuit 210 and collect a signal of the interface port IO by using the input branch 220.

In a possible implementation, when the interface circuit is configured as the LIN bus interface, the controller 240 controls to turn on the first switch component 2313, and controls the H-bridge circuit 210 to: output a low-side output based on LIN bus timing, or output a high-impedance output based on LIN bus timing.

In a possible implementation, when the interface circuit is configured as the SENT bus interface, the controller 240 controls to turn on the second switch component 2322, and controls the H-bridge circuit 210 to output a high-impedance output based on SENT bus timing.

In a possible implementation, when the interface circuit is configured as the two output ends cooperating with each other to work, the controller 240 controls the interface circuit to generate a power supply voltage for a vehicle-mounted electronic device at the first output end of the H-bridge circuit 210 and perform communication at the second output end through the following interface: a LIN bus interface, the SENT bus interface, a 12 V power output interface, a 5 V digital signal input interface, a 5 V digital signal output interface, or a 12 V digital signal input interface.

In a possible implementation, a power supply of the H-bridge circuit 210 is 12 V, the LIN bus power supply is 12 V, and/or the SENT bus power supply is 5 V.

In a possible implementation, the H-bridge circuit 210 and a LIN bus share one power supply.

In a possible implementation, the controller is a micro control unit (MCU).

DESCRIPTION OF EMBODIMENTS

For ease of understanding, an application scenario of the embodiments of this application is first briefly described.

Figure 1:
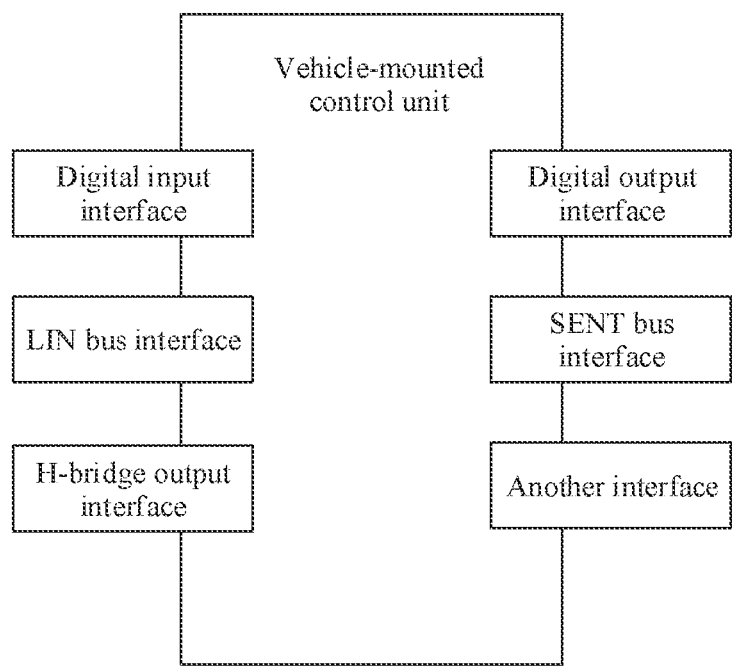
FIG. 1 is an example diagram of an interface of a typical vehicle-mounted control unit.

With development of automobile technologies and increase of people's requirements for automobile functions, there are more types of vehicle-mounted electronic devices. A vehicle-mounted control unit such as an electronic control unit (ECU), a vehicle control unit (VCU), or a hybrid control unit (HCU) is an important component for managing and controlling the vehicle-mounted electronic devices. Currently, a vehicle usually includes tens of or even hundreds of vehicle-mounted control units. To meet connection requirements of the different vehicle-mounted electronic devices on the vehicle, the vehicle-mounted control units usually need to be equipped with a plurality of dedicated interfaces, such as a digital input interface, a digital output interface, a LIN bus interface, a SENT bus interface, and an H-bridge output interface, as shown in FIG. 1. However, a vehicle is a personalized product. Different vehicle models are usually equipped with different vehicle-mounted electronic devices. Vehicle-mounted electronic devices in different locations of a same vehicle model are also different, and the vehicle-mounted electronic devices also have different requirements for quantities of various interfaces. A case in which interfaces of one type are insufficient but interfaces of another type are remaining may easily occur in selection of a vehicle-mounted control unit. As a result, requirement pressure of interfaces of one type is high, and resources of the interfaces of the another type is wasted. Certainly, a dedicated vehicle-mounted control unit may be designed according to actual scenarios. However, if the scenarios are not widely covered, designing another vehicle-mounted control unit only by modifying several interfaces certainly increases costs.

In the conventional technology, a configurable solution of an interface of an ECU is proposed. A complex programmable logic device (CPLD) is mainly used to implement control connection between a main control chip and an output circuit. Then, the output circuit is configured as a multi-functional interface circuit under the control of the main control chip, so that the output circuit has functions of interfaces such as a digital input interface, a digital output interface, and an H-bridge output interface. It can be learned that, designing the dedicated interface as the multi-functional interface can increase control flexibility, but prices of the CPLD and the main control chip used in the conventional technology are relatively high. As a result, manufacturing costs of the ECU are significantly increased. In addition, the interface circuit provided in the conventional technology does not meet electrical characteristic requirements of a LIN bus interface and a SENT bus interface, and therefore is not appropriate for transmitting signals of a LIN bus and a SENT bus.

To resolve the foregoing problems, the embodiments of this application provide an interface circuit of a vehicle-mounted control unit. The interface circuit may be configured as one or more of the following interfaces under the control of a controller: an H-bridge output interface, a 12 V power output interface, a 5 V digital signal output interface, a 5 V digital signal input interface, 12 V digital signal input interface, a LIN bus interface, and/or a SENT bus interface. The multi-functional interface circuit provided in the embodiments of this application can reduce costs, and reduce requirement pressure of diversified vehicle-mounted electronic devices on diversified interfaces of the vehicle-mounted control unit.

The following describes technical solutions of this application with reference to accompanying drawings.

Figure 2:
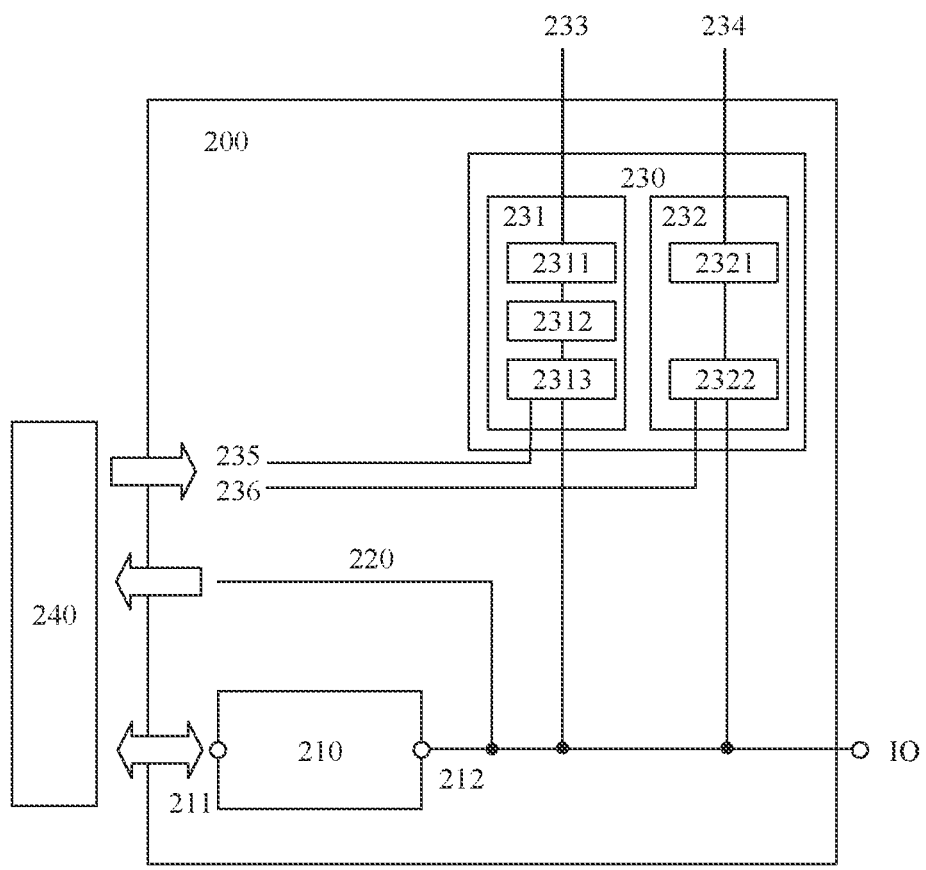
FIG. 2 is an example structural diagram of an interface circuit of a vehicle-mounted control unit according to an embodiment of this application.

FIG. 2 is an example structural diagram of an interface circuit of a vehicle-mounted control unit according to an embodiment of this application. As shown in FIG. 2, the interface circuit 200 includes at least an H-bridge circuit 210, an input branch 220, and a pull-up network 230.

An input end 211 of the H-bridge circuit 210 is connected to a controller 240, and an output end 212 of the H-bridge circuit 210 is connected to an interface port IO of the interface circuit 200. A first end of the input branch 220 is connected to the interface port IO, and a second end of the input branch 220 is connected to the controller 240. The pull-up network 230 includes a LIN bus pull-up resistor branch 231 and/or a SENT bus pull-up resistor branch 232.

The LIN bus pull-up resistor branch 231 is provided with a LIN bus pull-up resistor 2311, a diode 2312, and a first switch component 2313. A first end of the LIN bus pull-up resistor 2311 is connected to a LIN bus power supply 233, a second end of the LIN bus pull-up resistor 2311 is connected to an anode of the diode 2312, and a cathode of the diode 2312 is connected to the interface port IO by using the first switch component 2313. The SENT bus pull-up resistor branch 232 is provided with a SENT bus pull-up resistor 2321 and a second switch component 2322. A first end of the SENT bus pull-up resistor 2321 is connected to a SENT bus power supply 234, and a second end of the SENT bus pull-up resistor 2321 is connected to the interface port IO by using the second switch component 2322. On-off of the first switch component 2313 is controlled by the controller 240 by using a first control branch 235 and/or on-off of the second switch component 2322 is controlled by the controller 240 by using a second control branch 236.

The interface circuit may be configured as one or more of the following interfaces under the control of the controller 240: an H-bridge output interface, a 12 V power output interface, a 5 V digital signal output interface, a 5 V digital signal input interface, a 12 V digital signal input interface, a LIN bus interface, and/or a SENT bus interface. It should be understood that the foregoing description may be replaced with that the controller 240 controls an output of the H-bridge circuit, so that an interface port has interface functions of any one or more of the following interfaces: an H-bridge output interface, a 12 V power output interface, a 5 V digital signal output interface, a 5 V digital signal input interface, a 12 V digital signal input interface, a LIN bus interface, and/or a SENT bus interface.

The interface circuit provided in this embodiment of this application is a configurable multi-functional interface circuit, and can be configured as a plurality of different types of interfaces under the control of the controller 240, so that the interface circuit is applied to more types of vehicle-mounted electronic devices. This can reduce requirement pressure of diversified vehicle-mounted electronic devices on diversified interfaces of the vehicle-mounted control unit.

Optionally, the H-bridge circuit 210 may be a full-bridge circuit, or may be two half-bridge circuits. The output end 212 of the H-bridge circuit 210 includes a first output end and a second output end. The interface port IO includes a first interface port $IO_A$ and a second interface port $IO_B$. The first interface port $IO_A$ is connected to the first output end, and the second interface $IO_B$ is connected to the second output end.

It should be understood that, in this embodiment of this application, two interface ports IO are set to implement positive rotation and reversal rotation of a direct-current brush motor when the interface ports IO are externally connected to the motor. When some other vehicle-mounted electronic devices are externally connected, the two interface ports may work independently. For example, one of the interface ports may be connected to a vehicle-mounted electronic device, or the two interface ports may be separately connected to two vehicle-mounted devices. Alternatively, the two interface ports may cooperate with each other for use. For example, one interface port is used to provide a power supply voltage for a vehicle-mounted electronic device, and the other interface port is used to communicate with the vehicle-mounted electronic device. This improves resource utilization. It should be further understood that, if there is no need to externally connect to a direct-current brush motor, only one interface port may be configured. This is not limited in this application.

Optionally, the input branch 220 may include one input branch, or may include two input branches: a first input branch and a second input branch. When the input branch 220 includes one input branch, the input branch is connected to the first interface port $IO_A$ or the second interface port $IO_B$, so that the interface circuit may be configured as one digital signal input interface. When the input branch 220 includes two input branches, the two input branches are connected to the first interface port $IO_A$ and the second interface port $IO_B$ respectively, so that the interface circuit may be configured as two digital signal input interfaces.

Optionally, the LIN bus pull-up resistor branch 231 may include one branch, so that the interface circuit may be configured as one LIN bus interface.

Optionally, in a manner, the LIN bus pull-up resistor branch 231 may also include a first LIN bus pull-up resistor branch and a second LIN bus pull-up resistor branch that are connected in parallel, so that the interface circuit may be configured as two LIN bus interfaces.

Specifically, the LIN bus pull-up resistor 2311 may include a first pull-up resistor R1 and a second pull-up resistor R2. The diode 2312 disposed on the LIN bus pull-up resistor branch 231 includes a first diode D1 and a second diode D2. The first switch component 2313 disposed on the LIN bus pull-up resistor branch 231 includes a third switch component S1 and a fourth switch component S2. The first LIN bus pull-up resistor branch includes the first pull-up resistor R1, the first diode D1, and the third switch component S1. A first end of the first pull-up resistor R1 is connected to the LIN bus power supply 233, a second end of the first pull-up resistor R1 is connected to an anode of the diode D1, and a cathode of the diode D1 is connected to the first interface port $IO_A$ by using the third switch component S1. The second LIN bus pull-up resistor branch includes the second pull-up resistor R2, the second diode D2, and the fourth switch component S2. A first end of the second pull-up resistor R2 is connected to the LIN bus power supply 233, a second end of the second pull-up resistor R2 is connected to an anode of the diode D2, and a cathode of the diode D2 is connected to the second interface port $IO_B$ by using the first switch component S2. In addition, the first control branch 235 may include a third control branch K1 and a fourth control branch K2. The controller 240 controls on-off of the third switch component S1 and the fourth switch component S2 by using the third control branch K1 and the fourth control branch K2 respectively.

Optionally, the SENT bus pull-up resistor branch 232 may include one branch, so that the interface circuit may be configured as one SENT bus interface.

Optionally, in a manner, the SENT bus pull-up resistor branch 232 may also include a first SENT bus pull-up resistor branch and a second SENT bus pull-up resistor branch that are connected in parallel, so that the interface circuit may be configured as two SENT bus interfaces.

Specifically, the SENT bus pull-up resistor 2321 may include a third pull-up resistor R3 and a fourth pull-up resistor R4. The second switch component 2322 disposed on the SENT bus pull-up resistor branch 232 includes a fifth switch component and a sixth switch component. The first SENT bus pull-up resistor branch includes the third pull-up resistor R3 and the fifth switch component S3. A first end of the third pull-up resistor R3 is connected to the SENT bus power supply 234, and a second end of the third pull-up resistor R3 is connected to the first interface port $IO_A$ by using the fifth switch component S3. The second SENT bus pull-up resistor branch includes the fourth pull-up resistor R4 and the sixth switch component S4. A first end of the fourth pull-up resistor R4 is connected to the SENT bus power supply 234, and a second end of the fourth pull-up resistor R4 is connected to the second interface port $IO_B$ by using the sixth switch component S4. In addition, the second control branch 236 may include a fifth control branch K3 and a sixth control branch K4. The controller 240 controls on-off of the fifth switch component S3 and the sixth switch component S4 by using the fifth control branch K3 and the sixth control branch K4 respectively.

In this embodiment of this application, R1 and R2 are LIN bus pull-up resistors, and resistance values may be 1 KΩ; and R3 and R4 are SENT bus pull-up resistors, and resistance values may range from 10 kΩ to 55 kΩ. It should be understood that, in this application, only a connection relationship between components in the pull-up network and a parameter range of a pull-up resistor are limited, but a parameter range of a diode and a specific implementation form of a switch component are not limited. For example, a switch component may include a metal-oxide-semiconductor (MOS) transistor switch circuit, and a diode may use a 1N4148 diode. It should be understood that the foregoing is merely an example, and is not specifically limited.

Optionally, the H-bridge circuit 210 may be an H-bridge circuit with a high-impedance output, so that the interface port IO further has an input function. It should be understood that, in an actual operation, when the interface port IO is used as an output interface, the controller controls the H-bridge circuit 210 not to generate a high-impedance output. When the interface port is used as an input interface, the controller controls the H-bridge circuit 210 to generate a high-impedance output.

The following briefly describes configuration manners of the plurality of interfaces.

When the interface circuit 200 needs to be configured as the H-bridge output interface, the interface circuit 200 is controlled by the controller 240 to output a control signal of a direct-current brush motor in the H-bridge circuit 210. Specifically, the controller 240 controls the H-bridge circuit 210 to output a high-side output at $IO_A$ and output a low-side output at $IO_B$; or to output a low-side output at $IO_A$ and output a high-side output at $IO_B$, so that the interface circuit 200 is configured as one H-full-bridge output interface. Alternatively, an H-half-bridge circuit is controlled to output a low-side output or high-side output at $IO_A$ and/or $IO_B$, so that the interface circuit 200 is configured as one or two H-half-bridge output interfaces.

It should be understood that the high-side output is controlled by turning off a high-side switch, and the high-side switch is located at a power supply end. The low-side output is controlled by turning off a low-side switch, and the low-side switch is located at a ground end.

When the interface circuit 200 needs to be configured as the 12 V power output interface, the interface circuit 200 is controlled by the controller 240 to output a high-side output in the H-bridge circuit 210. Specifically, the interface circuit 200 outputs a high-side output at $IO_A$ and/or $IO_B$, so that the interface circuit 200 is configured as one or two 12 V power output interfaces.

When the interface circuit 200 needs to be configured as the 5 V digital signal output interface, the interface circuit 200 is controlled by the controller 240 to output a low-side output in the H-bridge circuit 210. Specifically, the interface circuit 200 outputs a low-side output at $IO_A$ and/or $IO_B$, so that the interface circuit 200 is configured as one or two 5 V digital signal output interfaces. It should be further understood that, in this case, use of +5 V terminal depends on an actual situation: If another +5 V terminal, with a same electrical characteristic, of the vehicle-mounted control unit where the interface circuit is located cannot be reused, the +5 V terminal needs to be led from the interface circuit. If another +5 V terminal, with a same electrical characteristic, of the vehicle-mounted control unit where the interface circuit is located can be reused the +5 V terminal does not need to be led from the interface circuit.

When the interface circuit 200 needs to be configured as the 5 V digital signal input interface, the interface circuit 200 is controlled by the controller 240 to output a high-impedance output in the H-bridge circuit 210. Specifically, the interface circuit 200 outputs a high-impedance output at $IO_A$ and/or $IO_B$, and collects a signal of the interface port IO by using the input branch 220, so that the interface circuit 200 is configured as one or two 5 V digital signal input interfaces. It should be further understood that, in this case, use of +5 V depends on an actual situation: If another +5 V terminal, with a same electrical characteristic, of the vehicle-mounted control unit where the interface circuit is located cannot be reused, the +5 V terminal needs to be led from the interface circuit. If another +5 V terminal, with a same electrical characteristic, of the vehicle-mounted control unit where the interface circuit is located can be reused, the +5 V terminal does not need to be led from the interface circuit.

When the interface circuit 200 needs to be configured as the 12 V digital signal input interface, the interface circuit 200 is controlled by the controller 240 to output a high-impedance output in the H-bridge circuit 210. Specifically, the interface circuit 200 outputs a high-impedance output at $IO_A$ and/or $IO_B$, and collects a signal of the interface port IO by using the input branch 220, so that the interface circuit 200 is configured as one or two 12 V digital signal input interfaces.

When the interface circuit 200 needs to be configured as the LIN bus interface, the interface circuit 200 is controlled by the controller 240 to turn on the first switch component 2313, and the H-bridge circuit 210 is controlled to output a low-side output at $IO_A$ and/or $IO_B$ based on LIN bus timing or output a high-impedance output at $IO_A$ and/or $IO_B$ based on LIN bus timing, so that the interface circuit 200 is configured as one or two LIN bus interfaces.

When the interface circuit 200 needs to be configured as the SENT bus interface, the interface circuit 200 is controlled by the controller 240 to turn on the second switch component 2322, and the H-bridge circuit 210 is controlled to output a high-impedance output at $IO_A$ and/or $IO_B$ based on SENT bus timing, so that the interface circuit 200 is configured as one or two SENT bus interfaces.

Optionally, the interface circuit 200 may be further configured as the two output ends cooperating with each other to work. For example, the interface circuit 200 is controlled by the controller 240 to generate a power supply voltage for a vehicle-mounted electronic device at the first output end of the H-bridge circuit 210 and perform communication at the second output end through any one of the following interfaces: a LIN bus interface, a SENT bus interface, a 12 V power output interface, a 5 V digital signal input interface, a 5 V digital signal output interface, or a 12 V digital signal input interface.

Optionally, a power supply of the H-bridge circuit 210 may be 12 V. Because 12 V is a common power supply in a vehicle, the 12 V power supply is used, so that the interface circuit can be used in the vehicle. This cannot be construed as a limitation on this application.

Optionally, the LIN bus power supply may be 12 V. Because 12 V is a commonly used power supply in the LIN bus, the 12 V power supply is used. This cannot be construed as a limitation on this application.

Optionally, the SENT bus power supply may be 5 V. Because 5 V is a commonly used power supply in the SENT bus, the 5 V power supply is used. This cannot be construed as a limitation on this application.

Optionally, in this embodiment of this application, to fully use resources, the H-bridge circuit 210 and the LIN bus may share the 12 V power supply.

Optionally, the interface circuit 200 may further include a protection circuit configured to ensure that the interface circuit runs safely and reliably. Specifically, the protection circuit may include a level conversion and input protection circuit 250, and an electromagnetic compatibility (EMC) and/or electrostatic discharge (ESD) protection circuit 260. The level conversion and input protection circuit 250 is located on the input branch. The EMC and/or ESD protection circuit 260 is located on a connection line between the interface port IO and the output end 212 of the H-bridge circuit 210.

Optionally, as a control component of the interface circuit, the controller may be a micro control unit (MCU), or may be a microprocessor unit (MPU). It should be understood that all controllers that can configure the interface circuit in this embodiment of this application as a plurality of interface functions fall within the protection scope of this application. In the following embodiments, an MCU is used as an example for description. However, it should be understood that this constitutes no limitation on this application.

It should be understood that, a model used by the MCU connected to the interface circuit and whether a +3 V power supply or +5 V power supply is used are not limited in this embodiment of this application.

It should be understood that specific implementation forms of the H-bridge circuit with a high-impedance output, the level conversion and input protection circuit, and the EMC and/or ESD protection circuit are not limited in this application, and whether the H-bridge circuit with a high-impedance output has a pulse-width modulation (PWM) function is not limited in this application. For example, the H-bridge circuit with a high-impedance output may include a discrete component and/or an H-bridge chip such as an MC33926. The level conversion and input protection circuit may include a discrete component and/or a level conversion chip such as a CD4050B. The EMC/ESD circuit may include a discrete component and/or a dedicated chip. It should be understood that the foregoing is merely an example, and is not specifically limited.

It should be understood that, compared with the conventional technology, this embodiment may obtain more interface functions with little costs increase. Specifically, the costs difference mainly lies in a difference between total costs of a resistor, a capacitor, a diode, an MOS transistor, a level conversion chip, and an EMC/ESD protection chip that are in the interface circuit and total costs of the CPLD and a peripheral circuit of the CPLD used in the conventional technology 1. The costs difference usually differs by one order of magnitude.

The following describes in detail, with reference to the accompanying drawings, an interface circuit structure, a plurality of interface configuration manners, and application scenarios that are provided in the embodiments of this application.

Figure 3:
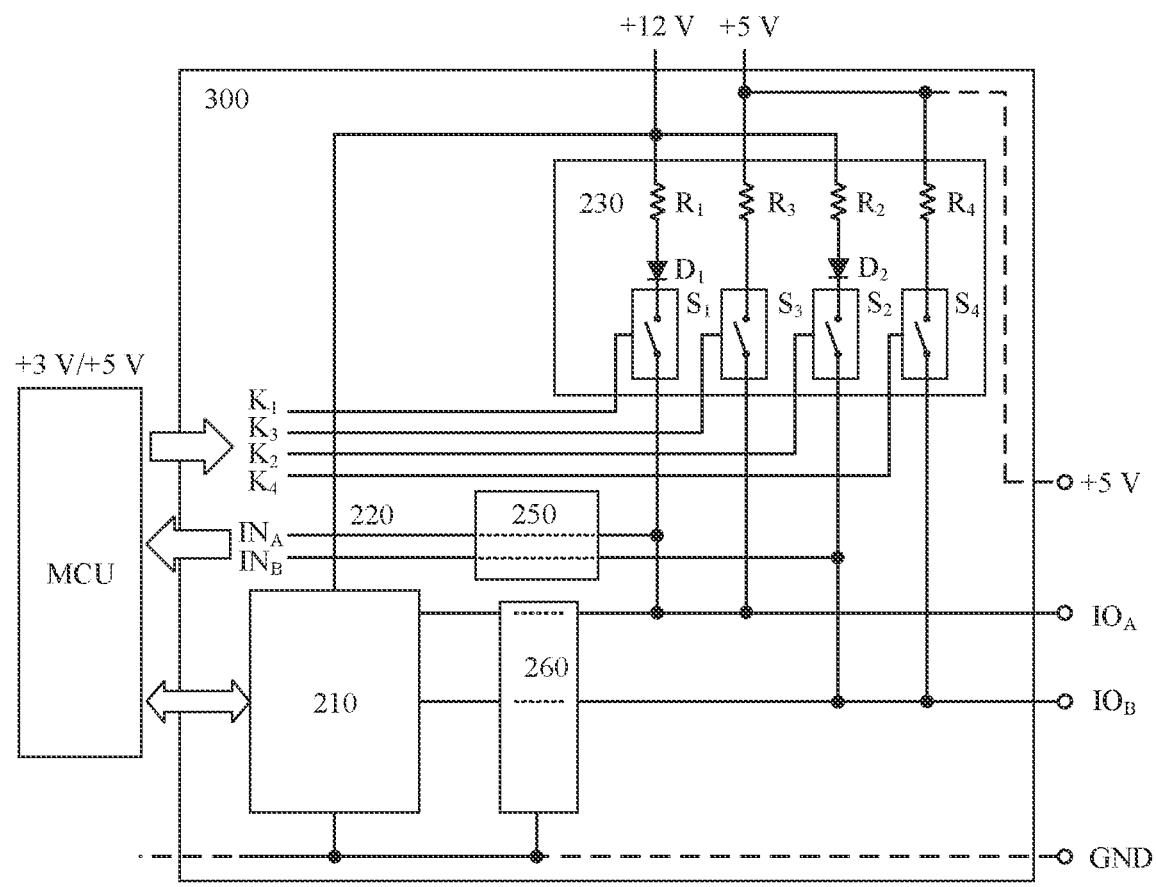
FIG. 3 is an example structural diagram of another interface circuit of a vehicle-mounted control unit according to an embodiment of this application.

In a manner, FIG. 3 is an example structural diagram of another interface circuit of a vehicle-mounted control unit according to an embodiment of this application. As shown in FIG. 3, the interface circuit 300 includes an H-bridge circuit 210, an input branch 220, a pull-up network 230, a level conversion and input protection circuit 250, and an EMC and/or ESD protection circuit 260.

The H-bridge circuit 210 is an H-bridge circuit with a high-impedance output, and includes two output ends. The interface circuit 300 includes two interface ports $IO_A$ and $IO_B$. The input branch 220 includes two input branches. The pull-up network 230 includes two pull-up resistor branches of a LIN bus and/or two pull-up resistor branches of a SENT bus. A control branch includes two LIN bus switch control branches and two SENT bus switch control branches.

Specifically, a connection manner is that an input end 211 of the H-bridge circuit 210 is connected to an MCU, and the two output ends of the H-bridge circuit 210 are respectively connected to the two interface ports $IO_A$ and $IO_B$ of the interface circuit 300. A power supply of the H-bridge circuit 210 is 12 V. First ends of the two input branches are connected to the interface port $IO_A$ and the interface port $IO_B$, and second ends of the input branches are connected to the MCU. The MCU can read a level status of an input branch $IN_A$ or an input branch $IN_B$ to obtain a level status of a connection line between $IO_A$ or $IO_B$ and the output end. The level conversion and input protection circuit 250 is located on the input branch 220. The EMC and/or ESD protection circuit 260 is located at connection line between the interface port and the output end 212 of the H-bridge circuit 210. The two LIN bus pull-up resistor branches include a first LIN bus pull-up resistor branch and a second LIN bus pull-up resistor branch that are connected in parallel. The first LIN bus pull-up resistor branch includes R1, D1, and S1. A first end of R1 is connected to a 12 V LIN bus power supply, a second end of R1 is connected to an anode of D1, and a cathode of D1 is connected to $IO_A$ by using S1. The second LIN bus pull-up resistor branch includes R2, D2, and S2. A first end of R2 is connected to the 12 V LIN bus power supply, a second end of R2 is connected to an anode of D2, and a cathode of D2 is connected to the $IO_B$ by using S2. The two SENT bus pull-up resistor branches include a first SENT bus pull-up resistor branch and a second SENT bus pull-up resistor branch that are connected in parallel. The first SENT bus pull-up resistor branch includes R3 and S3. A first end of R3 is connected to a 5 V SENT bus power supply, a second end of R3 is connected to $IO_A$ by using S3. The second SENT bus pull-up resistor branch includes R4 and S4. A first end of R4 is connected to the 5 V SENT bus power supply, and a second end of R4 is connected to the $IO_B$ by using S4. S1, S2, S3, and S4 are connected to the MCU through control branches K1, K2, K3, and K4, and are turned on and turned off under the control of the MCU.

The interface circuit 300 may be configured as the following plurality of interfaces under the control of the MCU: air H-bridge output interface, a 12 V power output interface, a 5 V digital signal output interface, a 5 V digital signal input interface, a 12 V digital signal input interface, a LIN bus interface, and/or a SENT bus interface.

With reference to FIG. 4 to FIG. 10, the following describes in detail, manners configuring the interface circuit 300 as the plurality of interfaces and application scenarios.

First Configuration Manner: The H-Bridge Output Interface (Full-Bridge).

Optionally, the interface circuit 300 may be configured as an H-full-bridge output interface.

Specifically, a process of configuring as the H-full-bridge output interface is as follows: The MCU controls the switch components S1, S2, S3, and S4 in the pull-up network 230 to be turned off, and controls the H-bridge circuit 210 with a high-impedance output to output a control signal of a direct-current brush motor.

Figure 4:
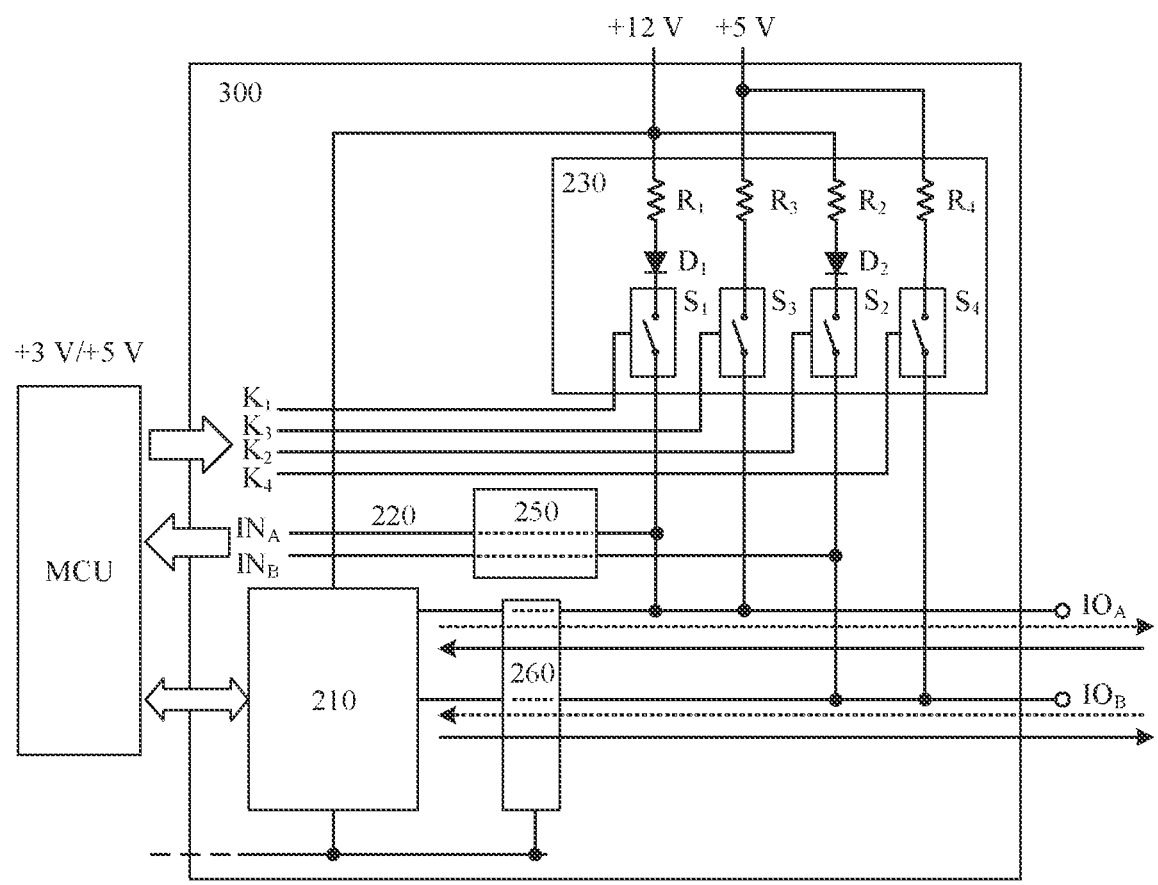
FIG. 4 is a detailed example diagram of current directions when the interface circuit in FIG. 3 is configured as an H-full-bridge output interface.

FIG. 4 is a detailed example diagram of current directions when the interface circuit in FIG. 3 is configured as the H-full-bridge output interface. As shown in FIG. 4, in an implementation, when the H-bridge circuit 210 with a high-impedance output is controlled to output a high-side output at $IO_A$ and output a low-side output at $IO_B$, current directions of the interface terminals $IO_A$ and $IO_B$ are shown by dashed-line arrows. In another implementation, when the MCU is configured to control the H-bridge circuit 210 with a high-impedance output to output a low-side output at $IO_A$ and output a high-side output at $IO_B$, current directions of the interface ports $IO_A$ and $IO_B$ are shown by solid-line arrows.

It should be understood that, in this configuration manner, the MCU may or may not collect level statuses of $IN_A$ and $IN_B$ according to an actual requirement.

It should be understood that, the two interface ports of the interface circuit 300 may be connected to one direct-current brush motor peripheral in this configuration manner. Under the control of the MCU, the interface circuit 300 may drive the direct-current brush motor peripheral connected to both $IO_A$ and $IO_B$ to perform positive rotation and reversal rotation, and may implement speed control of the direct-current brush motor peripheral by controlling PWM of the H-bridge circuit. It should be understood that a common vehicle-mounted direct-current brush motor peripheral has a seat motor, a window motor, and the like. This is not specifically limited in this application. It should be understood that a peripheral is relative to one vehicle-mounted control unit. Another vehicle-mounted electronic device connected to the vehicle-mounted control unit is referred to as a peripheral of the electronic control unit, and for ease of description, the following is briefly referred to as a peripheral.

Second Configuration Manner: The H-Bridge Output Interface (Half-Bridge).

Optionally, the interface circuit 300 may be configured as two H-half-bridge output interfaces.

Specifically, a process of configuring as the two H-half-bridge output interfaces is as follows: The MCU controls the switch components S1, S2, S3, and S4 in the pull-up network 230 to be turned off, and controls the H-bridge circuit 210 with a high-impedance output to output a high-side output or output a low-side output. It should be understood that, in this configuration manner, a ground (GND) end of a wire further needs to be used, but how to use the ground end depends on a specific situation. If another GND terminal, with a same electrical characteristic, of the vehicle-mounted control unit where the interface circuit is located cannot be reused, the GND terminal needs to be led from the interface circuit. If another GND terminal, with a same electrical characteristic, of the vehicle-mounted control unit where the interface circuit is located can be reused, the GND terminal does not need to be led from the interface circuit.

Figure 5:
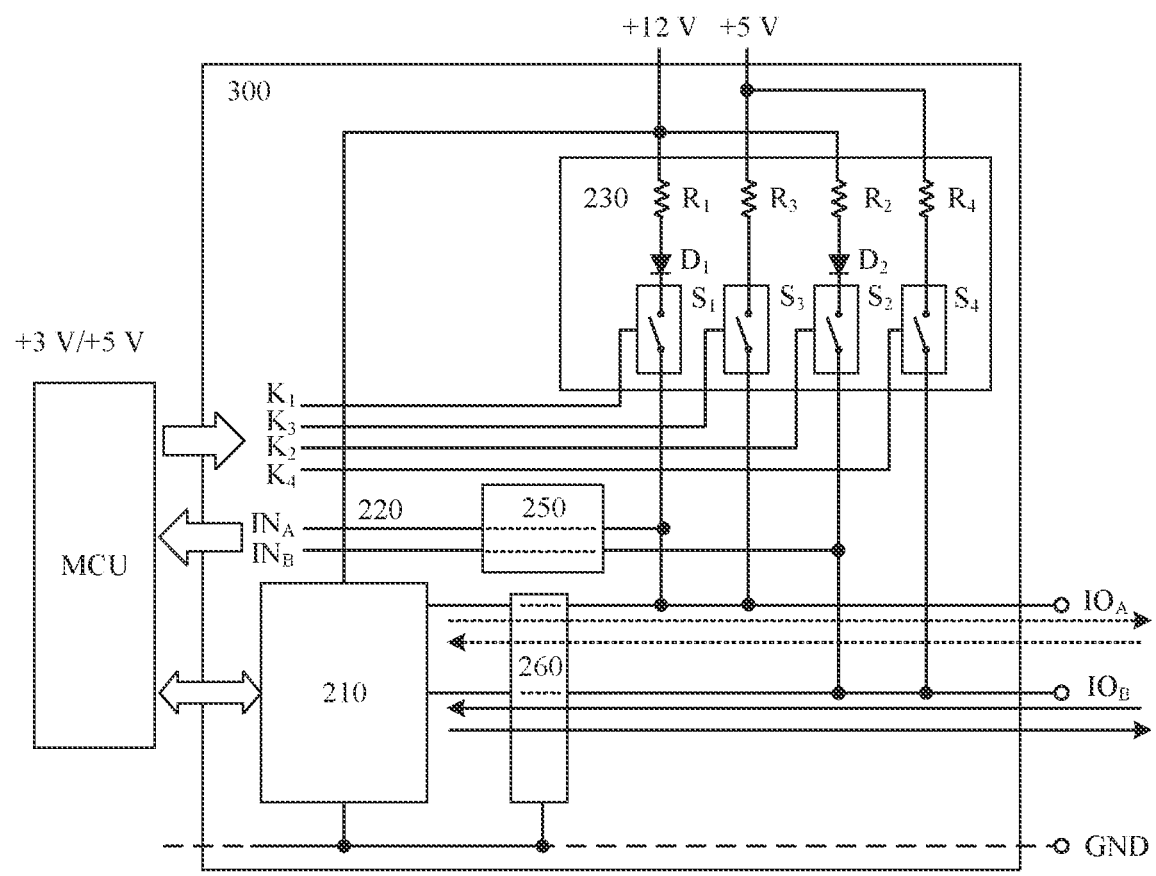
FIG. 5 is a detailed example diagram of current directions when the interface circuit in FIG. 3 is configured as two H-half-bridge output interfaces.

FIG. 5 is a detailed example diagram of current directions when the interface circuit in FIG. 3 is configured as the two H-half-bridge output interfaces. Functions of the two H-half-bridge output interfaces are the same. Therefore, only one H-half-bridge output interface is used as an example for detailed description. As shown by dashed-line arrows in FIG. 5, if the interface circuit needs to output an H-half-bridge with a high-side output at $IO_A$, the MCU controls the H-bridge circuit 210 with a high-impedance output to output a high-side output at $IO_A$. In this case, a current flows from the H-bridge circuit of the interface circuit to a peripheral load (a dashed line on the upper side) through $IO_A$. If the interface circuit needs to output an H-half-bridge with low-side output at $IO_A$, the MCU controls the H-bridge circuit 210 with a high-impedance output to output a low-side output at $IO_A$. In this case, a current flows from the peripheral load to the H-bridge circuit (a dashed line on the lower side) of the interface circuit through $IO_A$. Likewise, as shown by solid-line arrows in FIG. 5, the other $IO_B$ may also implement one H-half-bridge interface through same operations on $IO_A$.

It should be understood that $IO_A$ and $IO_B$ are independent of each other. In an actual operation, one of $IO_A$ and $IO_B$ may be controlled to work, or both $IO_A$ and $IO_B$ may be controlled to work independently. This is not limited in this application. It should be further understood that the foregoing explanation is also applied to a subsequent implementation, and details are not described again.

It should be understood that, in this configuration manner, the two interface ports of the interface circuit 300 may be connected to two motor peripherals respectively, and the interface circuit 300 may separately drive the motor peripherals to rotate in one direction under the control of the MCU. Alternatively, the two interface ports of the interface circuit 300 may be connected to a 12 V power output interface peripheral. This is not specifically limited in this application.

Third Configuration Manner: The LIN Bus Interface.

Optionally, the interface circuit 300 may be configured as two LIN bus interfaces.

Specifically, a process of configuring as the two LIN bus interfaces is as follows: The MCU controls the switch components S2 and S4 in the pull-up network 230 to be turned off, and controls the switch components S1 and S3 to be turned on, so as to generate the interface circuit meeting a specification requirement of the LIN bus interface, and control the H-bridge circuit with a high-impedance output to output a low-side output or high-impedance output based on LIN bus timing. It should be understood that a LIN bus signal is transmitted bidirectionally. Therefore, the interface ports $IO_A$ and $IO_B$ may input a signal and may output a signal. It should be understood that, in this configuration manner, a GND further needs to be used, but how to use the GND depends on a specific situation. If another GND terminal, with a same electrical characteristic, of the vehicle-mounted con it unit where the interface circuit is located cannot be reused, the GND terminal needs to be led from the interface circuit. If another GND terminal, with a same electrical characteristic, of the vehicle-mounted control unit where the interface circuit is located can be reused, the GND terminal does not need to be led from the interface circuit.

Figure 6:
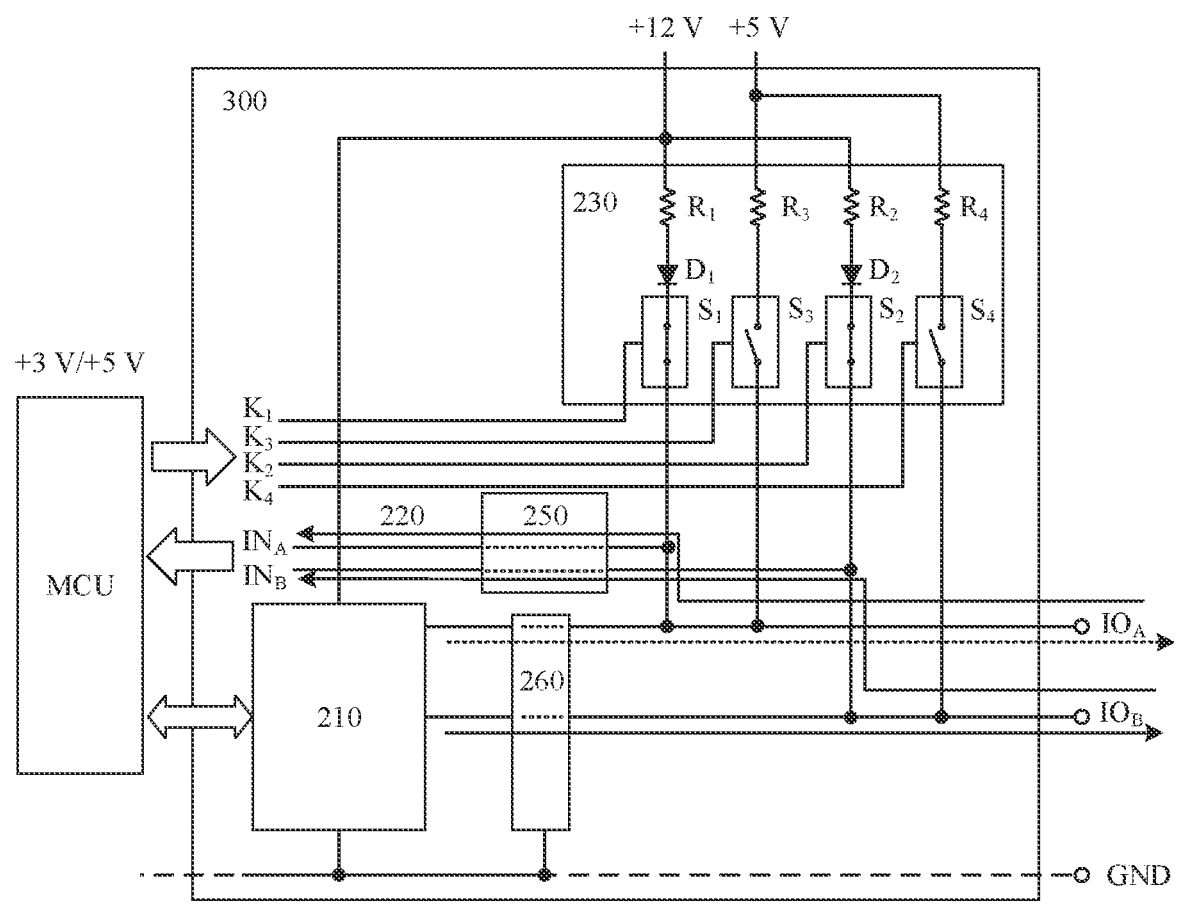
FIG. 6 is a detailed example diagram of signal directions when the interface circuit in FIG. 3 is configured as two LIN bus interfaces.

FIG. 6 is a detailed example diagram of signal directions when the interface circuit in FIG. 3 is configured as the two LIN bus interfaces. Functions of the two LIN bus interfaces are the same. Therefore, only one LIN bus interface is used as an example for detailed description. As shown by dashed-line arrows in FIG. 6, if the interface circuit needs to perform sending by using a primary LIN bus device through $IO_A$, the MCU controls the H-bridge circuit with a high-impedance output to output a low-side output at $IO_A$, so as to output a low level (a dashed line on the lower side) on an $IO_A$ connection line. If the sending state needs to be interrupted, the MCU controls the H-bridge circuit with a high-impedance output to output a high-impedance output at $IO_A$, so as to output a high level on the $IO_A$ connection line. When the interface circuit needs to perform receiving by using the primary LIN bus device through $IO_A$, the MCU controls the H-bridge circuit with a high-impedance output to output a high-impedance output at $IO_A$. In addition, the MCU is configured to read the level status of $IN_A$ to obtain a level status (a dashed line on the upper side) on the $IO_A$ connection line. Likewise, as shown by solid-line arrows in FIG. 6, the other $IO_B$ may also implement receiving and sending of signals of the primary LIN bus device through same operations on $IO_A$. It should be understood that, when only one interface port needs to be controlled to work, the MCU is configured to control the switch component S1 or S3 to be turned on, and the others to be turned off.

It should be understood that, in this configuration manner, the two interface ports of the interface circuit 300 may be connected to two LIN controller peripherals respectively, to implement control by using a secondary device interface peripheral of the LIN bus. A common vehicle-mounted secondary device interface peripheral of the LIN bus has a seat controller, a vehicle door lock controller, a vehicle window controller, a rain wiper controller, and the like.

Fourth Configuration Manner: The SENT Bus Interface.

Optionally, the interface circuit 300 may be configured as two SENT bus interfaces.

Specifically, a process of configuring as the two SENT bus interfaces is as follows: The MCU controls the switch components S1 and S3 in the pull-up network to be turned off, and controls the switch components S2 and S4 to be turned on, so as to generate the interface circuit meeting a specification requirement of the SENT bus interface, and control the H-bridge circuit with a high-impedance output to output a high-impedance output based on SENT bus timing. It should be understood that, when the interface circuit 300 is configured as the SENT bus interface, the interface ports $IO_A$ and $IO_B$ are mainly used to input signals. It should be understood that, in this configuration manner, a GND further needs to be used, but how to use the GND depends on an actual situation. If another GND terminal, with a same electrical characteristic, of the vehicle-mounted control unit where the interface circuit is located cannot be reused, the GND terminal needs to be led from the interface circuit. If another GND terminal, with a same electrical characteristic, of the vehicle-mounted control unit where the interface circuit is located can be reused, the GND terminal does not need to be led from the interface circuit. In addition, use of +5 V also depends on an actual situation: If another +5 V terminal, with a same electrical characteristic, of the vehicle-mounted control unit where the interface circuit is located cannot be reused, the +5 V terminal needs to be led from the interface circuit. If another +5 V terminal, with a same electrical characteristic, of the vehicle-mounted control unit where the interface circuit is located can be reused, the +5 V terminal does not need to be led from the interface circuit.

Figure 7:
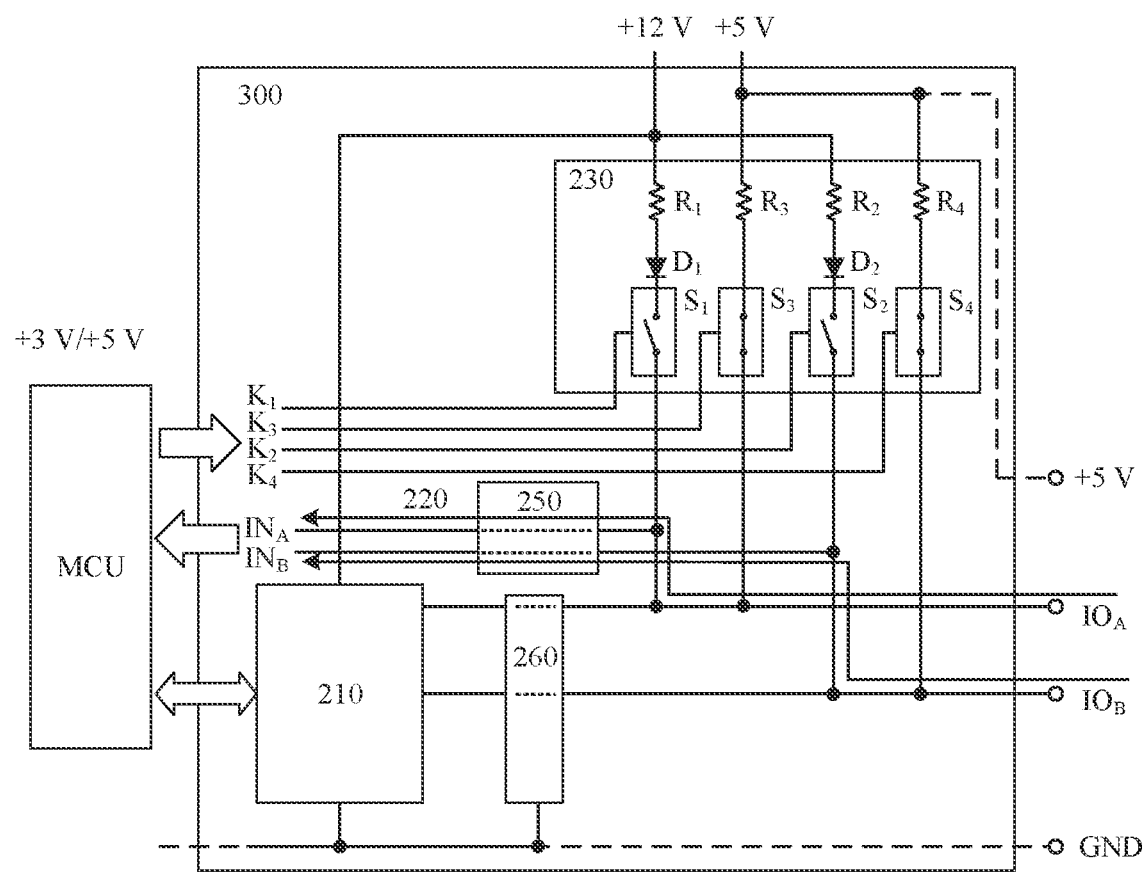
FIG. 7 is a detailed example diagram of signal directions when the interface circuit in FIG. 3 is configured as two SENT bus interfaces.

FIG. 7 is a detailed example diagram of signal directions when the interface circuit in FIG. 3 is configured as the two SENT bus interfaces. Functions of the two SENT bus interfaces are the same. Therefore, only one SENT bus interface is used as an example for detailed description. As shown by a dashed-line arrow in FIG. 7, when the interface circuit performs receiving by using a primary SENT bus device through $IO_A$, the MCU controls the H-bridge circuit with a high-impedance output to output a high-impedance output at $IO_A$, so as to generate a high level pulled up by a resistor on an $IO_A$ connection line. In addition, the MCU reads the level status of $IN_A$ to obtain a level status on the $IO_A$ connection line, and therefore obtain data sent from a secondary SENT bus device. Likewise, as shown by a solid-line arrow in FIG. 7, the other $IO_B$ may also implement receiving by using the primary SENT bus device through same operations on $IO_A$.

It should be understood that, when only one interface port needs to be controlled to work, the MCU is configured to control the switch component S2 or S4 to be turned on, and the others to be turned off.

It should be understood that, in this configuration manner, the two interface ports of the interface circuit 300 may be connected to two SENT bus sensor peripherals respectively, and may receive information reported by the SENT bus sensor peripherals. A common SENT bus vehicle-mounted interface peripheral has a temperature sensor, a pressure sensor, a position sensor, an angle sensor, and the like that conform to the SENT bus interface.

Fifth Configuration Manner: The 12 V Power Output Interface.

Optionally, the interface circuit 300 may be configured as two 12 V power output interfaces.

Specifically, a process of configuring as the two 12 V power output interfaces is as follows: The MCU controls the switch components S1, S2, S3, and S4 in the pull-up network to be turned off, and controls the H-bridge circuit with a high-impedance output to output a high-side output. It should be understood that, in this configuration manner, a GND further needs to be used, but how to use the GND depends on an actual situation. If another GND terminal, with a same electrical characteristic, of the vehicle-mounted control unit where the interface circuit is located cannot be reused, the GND terminal needs to be led from the interface circuit. If another GND terminal, with a same electrical characteristic, of the vehicle-mounted control unit where the interface circuit is located can be reused, the GND terminal does not need to be led from the interface circuit.

Figure 8:
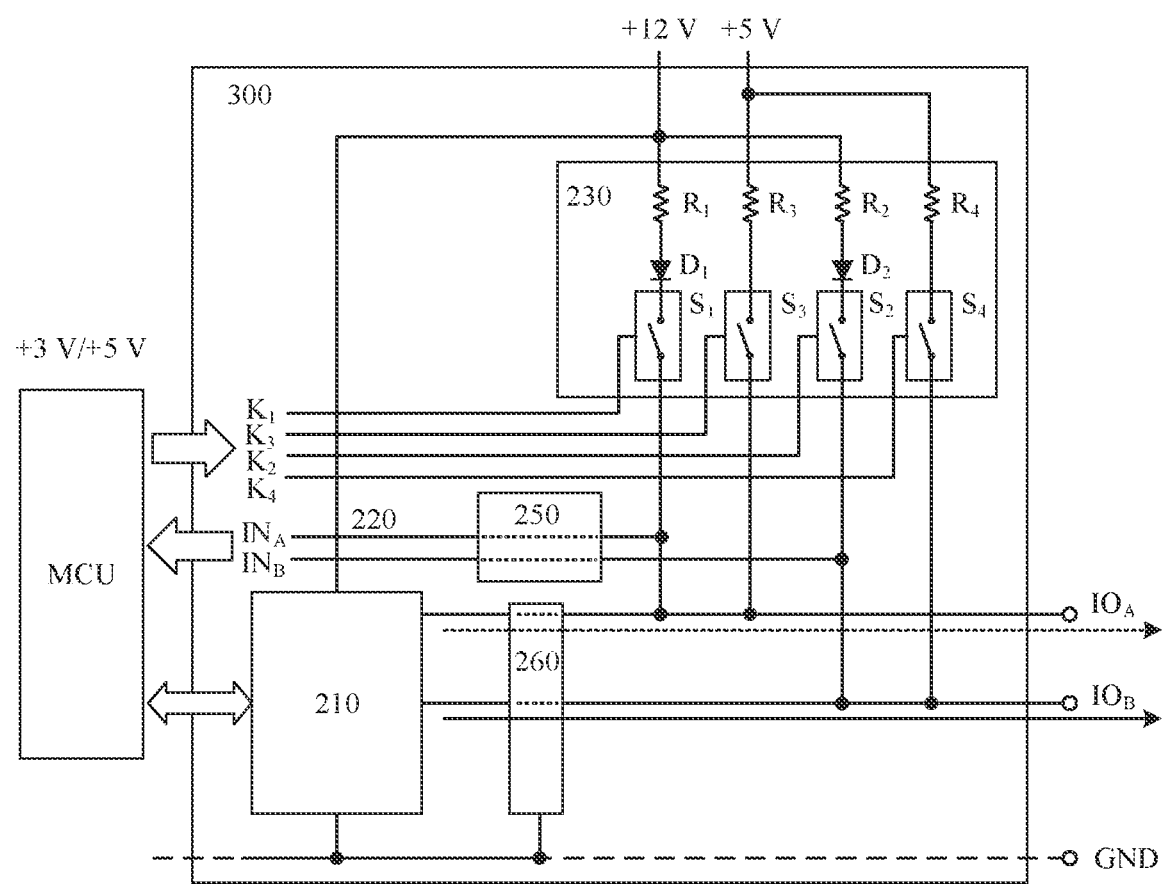
FIG. 8 is a detailed example diagram of current directions when the interface circuit in FIG. 3 is configured as two 12 V power output interfaces.

FIG. 8 is a detailed example diagram of current directions when the interface circuit in FIG. 3 is configured as the two 12 V power output interfaces. Functions of the two 12 V power output interfaces are the same. Therefore, only one 12 V power output interface is used as an example for detailed description. As shown by a dashed-line arrow in FIG. 8, the MCU controls the H-bridge circuit with a high-impedance output to output a high-side output at $IO_A$, that is, generate 12 V output at $IO_A$. If the 12 V power supply of $IO_A$ to a peripheral needs to be disabled, the MCU controls the H-bridge circuit with a high-impedance output to generate a high-impedance output or low-side output at $IO_A$. Likewise, as shown by a solid-line arrow in FIG. 8, the other $IO_B$ may also enable or disable a 12 V power output through same operations on $IO_A$.

It should be understood that, in this configuration manner, the two interface ports of the interface circuit 300 may be connected to two 12 V peripherals respectively, and may provide power output of specific power for 12 V devices. A common vehicle-mounted 12 V peripheral has an atmosphere light, an electric car window controller, and the like.

Sixth Configuration Manner: A 5 V Bidirectional Digital Signal Interface.

Optionally, the interface circuit 300 may be configured as two 5 V bidirectional digital signal interfaces. The 5 V bidirectional digital signal interface indicates that the interface circuit 300 may be configured as the 5 V digital signal input interface, or may be configured as the 5 V digital signal output interface.

Specifically, a process of configuring as the two 5 V bidirectional digital signal interfaces is as follows: The MCU controls the switch components S1 and S3 in the pull-up network to be turned off, and controls S2 and S4 to be turned on or turned off depending on an actual application situation. If a peripheral has a pull-up resistor, and the interface does not need to enable the pull-up resistor, the MCU controls S2 and S4 to be turned off. If the peripheral does not have a pull-up resistor, the MCU controls S2 and S4 to be turned on, and controls the H-bridge circuit with a high-impedance output to output a low-side output or high-impedance output. It should be understood that, in this configuration manner, a GND further needs to be used, but how to use the GND depends on an actual situation. If another GND terminal, with a same electrical characteristic, of the vehicle-mounted control unit where the interface circuit is located cannot be reused, the GND terminal needs to be led from the interface circuit. If another GND terminal, with a same electrical characteristic, of the vehicle-mounted control unit where the interface circuit is located can be reused, the GND terminal does not need to be led from the interface circuit. In addition, use of +5 V also depends on an actual situation: If another +5 V terminal, with a same electrical characteristic, of the vehicle-mounted control unit where the interface circuit is located cannot be reused, the +5 V terminal needs to be led from the interface circuit. If another +5 V terminal, with a same electrical characteristic, of the vehicle-mounted control unit where the interface circuit is located can be reused, the +5 V terminal does not need to be led from the interface circuit.

Figure 9:
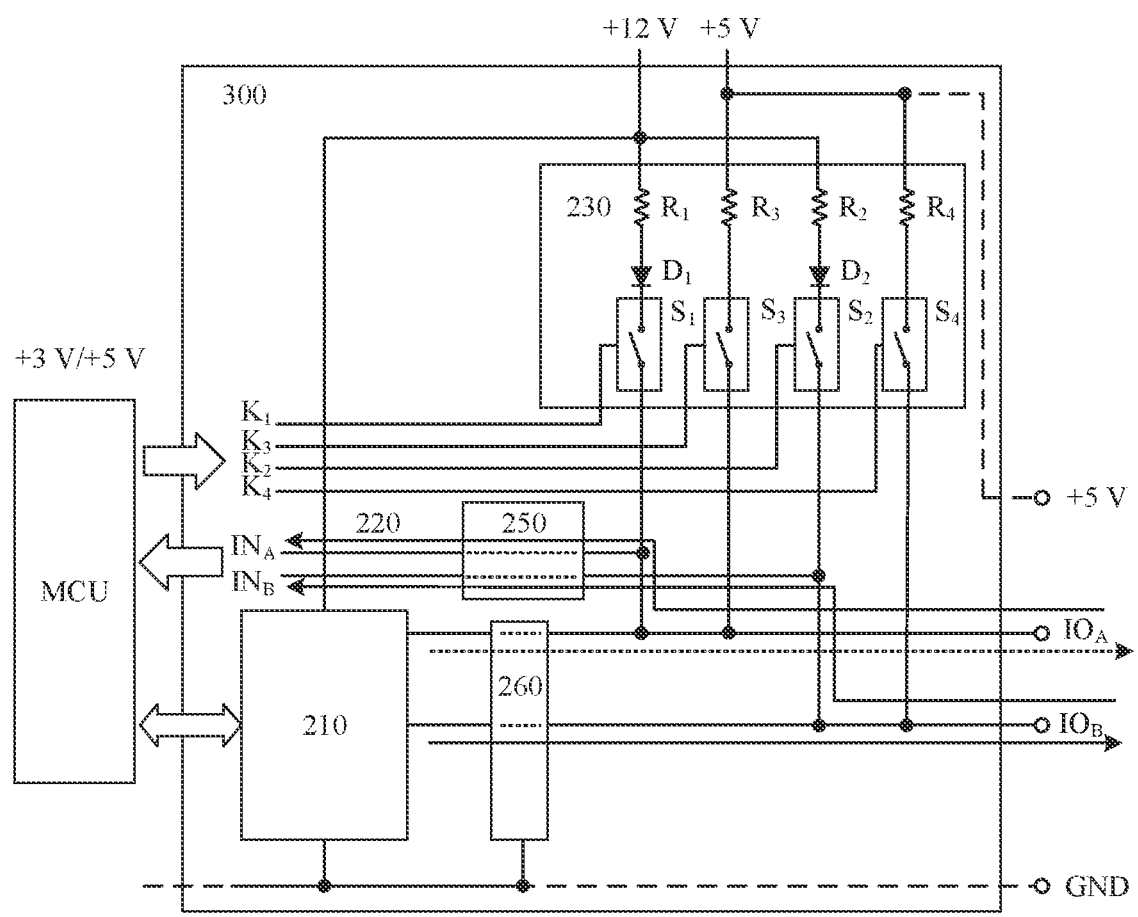
FIG. 9 is a detailed example diagram of signal directions when the interface circuit in FIG. 3 is configured as two 5 V bidirectional digital signal interfaces.

FIG. 9 is a detailed example diagram of signal directions when the interface circuit in FIG. 3 is configured as two 5 V bidirectional digital signal interfaces. Functions of the two 5 V bidirectional digital signal interfaces are the same. Therefore, only one 5 V bidirectional digital signal interface is used as an example for detailed description. As shown by dashed-line arrows in FIG. 9, if the interface circuit needs to perform data sending through $IO_A$, the MCU controls the H-bridge circuit with a high-impedance output to output a low-side output at $IO_A$, so as to output a low level (a dashed line on the lower side) on an $IO_A$ connection line. If the sending state needs to be interrupted, the MCU controls the H-bridge circuit with a high-impedance output to output a high-impedance output at $IO_A$, so as to output a high level on the $IO_A$ connection line. When the interface circuit needs to perform data receiving through $IO_A$, the MCU controls the H-bridge circuit with a high-impedance output to output a high-impedance output at $IO_A$. In addition, the MCU reads the level status of $IN_A$ to obtain a level status (a dashed line on the upper side) on the $IO_A$ connection line. Likewise, as shown by solid-line arrows in FIG. 9, the other $IO_B$ may also implement receiving and sending of 5 V bidirectional digital signals through same operations on $IO_A$.

It should be understood that, in this configuration manner, the two interface ports of the interface circuit 300 may be connected to two 5 V digital signal peripherals respectively, so as to implement bidirectional communication with the 5 V low-rate digital signal peripherals. A common vehicle-mounted 5 V low-rate peripheral has a temperature sensor, a pressure sensor, and the like that conform to a single-wire bidirectional communications bus interface.

Seventh Configuration Manner: The 12 V Digital Signal Input Interface.

Optionally, the interface circuit 300 may be configured as two 12 V digital signal input interfaces.

Specifically, a process of configuring as the two 12 V digital signal input interfaces is as follows: The MCU controls the switch components S2 and S4 in the pull-up network to be turned off, and controls the S1 and S3 to be turned on or turned off depending on an actual application situation. If a peripheral has a pull-up resistor or a pull-down resistor, and the interface does not need to enable a pull-up resistor, the MCU controls S1 and S3 to be turned off. If the peripheral does not have the pull-up resistor or the pull-down resistor and the interface circuit is expected to provide a pull-up resistor, the MCU controls S1 and S3 to be turned on, and controls the H-bridge circuit with a high-impedance output to output a high-impedance output. It should be understood that, in this configuration manner, a GND further needs to be used, but how to use the GND depends on an actual situation. If another GND terminal, with a same electrical characteristic, of the vehicle-mounted control unit where the interface circuit is located cannot be reused, the GND terminal needs to be led from the interface circuit. If another GND terminal with a same electrical characteristic, of the vehicle-mounted control unit where the interface circuit is located can be reused, the GND terminal does not need to be led from the interface circuit.

Figure 10:
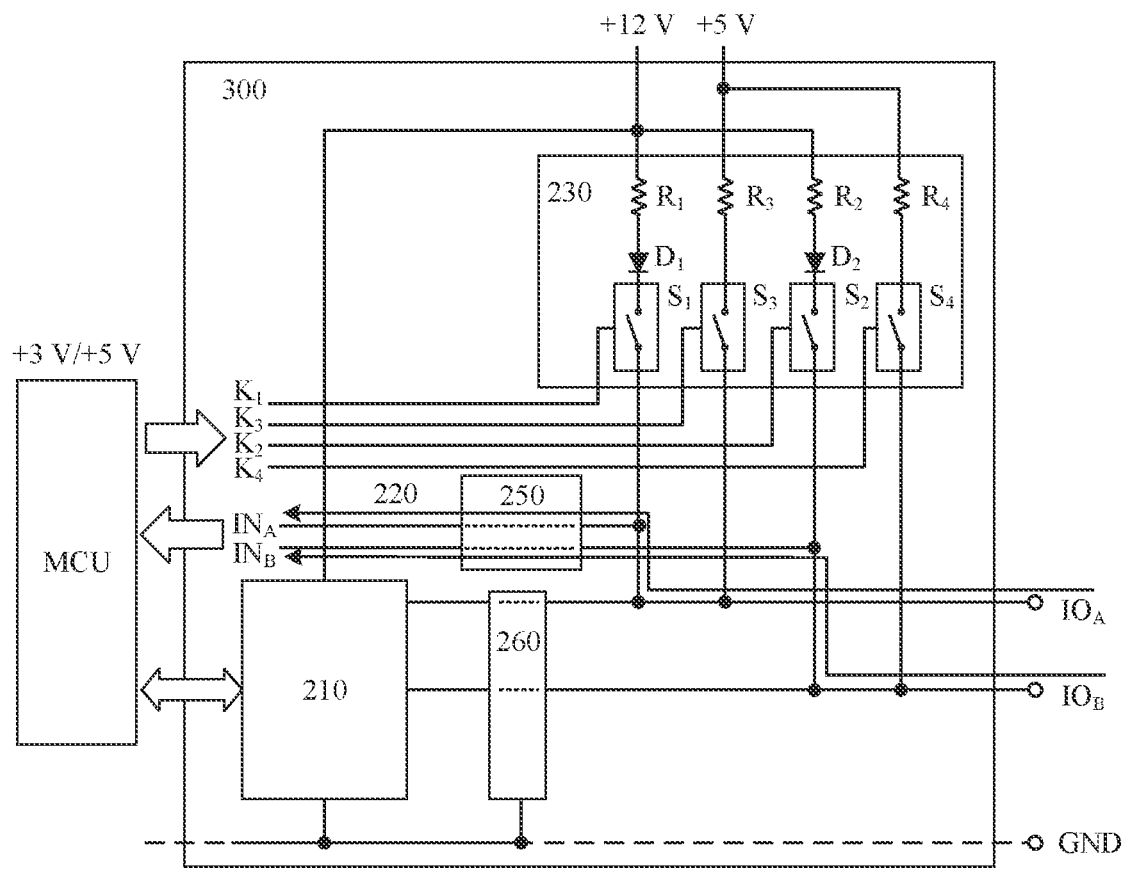
FIG. 10 is a detailed example diagram of signal directions when the interface circuit in FIG. 3 is configured as two 12 V digital signal input interfaces.

FIG. 10 is a detailed example diagram of signal directions when the interface circuit in FIG. 3 is configured as two 12 V digital signal input interfaces. Functions of the two 12 V digital signal input interfaces are the same. Therefore, only one 12 V digital signal input interface is used as an example for detailed description. As shown by a dashed-line arrow in FIG. 10, the MCU controls the H-bridge circuit with a high-impedance output to output a high-impedance output at $IO_A$, so as to generate a high level on an $IO_A$ connection line. In addition, the MCU reads the level status of $IN_A$ to obtain a level status on the $IO_A$ connection line. Likewise, as shown by a solid-line arrow in FIG. 10, the other $IO_B$ may also implement the 12 V digital signal input interface through same operations on $IO_A$.

It should be understood that, in this configuration manner, the two interface ports of the interface circuit 300 may be connected to two 12 V digital signal peripherals respectively, so as to collect a 12 V digital signal switch quantity. A common vehicle-mounted 12 V digital signal switch quantity includes an ignition lock signal, and the like.

Eighth configuration manner: When the interface port is used as any one of the following interfaces, one output end of the H-bridge circuit is controlled to provide a power supply voltage for a peripheral connected to the interface port, and the other output end is used to communicate with the peripheral: a LIN bus interface, a SENT bus interface, a 12 V power output interface, a 5 V digital signal input interface, a 5 V digital signal output interface, or a 12 V digital signal input interface.

For example, an $IO_A$ connection line may be used to supply 12 V power to the peripheral, and $IO_B$ is used to communicate with the peripheral through the LIN bus interface. Alternatively, an $IO_A$ connection line may be used to supply 12 V power to the peripheral, and $IO_B$ is used to communicate with the peripheral through the 5 V digital signal input interface. Details are not described herein in this application.

It should be understood that, in various combinations of every two of the configurations, because the two interfaces may be configured independently, in each interface circuit, the H-bridge circuit with a high-impedance output and the pull-up network circuit may be configured as the interface port $IO_A$ in Embodiment 2 to Embodiment 7.

It should be understood that use of GND and +5 V depends on an actual situation, and refer to the description in the foregoing configuration manners. This is not described herein again.

Figure 11:
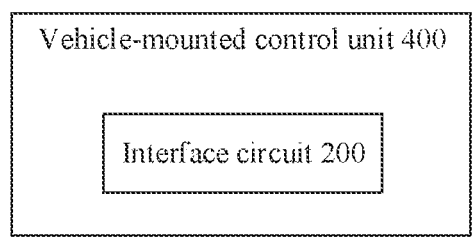
FIG. 11 is an example diagram of a vehicle-mounted control unit according to an embodiment of this application.

An embodiment of this application further provides a vehicle-mounted control unit 400. The vehicle-mounted control unit 400 includes one or more interface circuits 200. FIG. 11 is an example diagram of the vehicle-mounted control unit 400 according to this embodiment of this application. The vehicle-mounted control unit 400 includes the one or more interface circuits 300.

Optionally, the vehicle-mounted control unit may be an electronic control unit (ECU), may be a vehicle control unit (VCU), or may be a hybrid vehicle control unit (hybrid control unit, HCU). All vehicle-mounted control units that can be used in an interface circuit in this application fall within the protection scope of this application.

In this embodiment of this application, the vehicle-mounted control unit 400 including the one or more interface circuits 200 may be flexibly configured as one or more of the following interfaces: an H-bridge output interface, a LIN bus interface, a SENT bus interface, a 12 V power output interface, a 5 V digital signal input interface, 5 V digital signal output interface, and a 12 V digital signal input interface. This avoids costs increase caused by redesigning a vehicle-mounted control unit because the foregoing vehicle-mounted control unit does not reserve the foregoing interfaces or a quantity of interfaces is insufficient, or low resource utilization of interfaces of the vehicle-mounted control unit because interfaces of one type are insufficient but interfaces of another type are remaining.

Optionally, based on an actual requirement, one vehicle-mounted control unit 400 may configure one interface circuit 200, or configure a plurality of interface circuits 200. This is not limited in this application. For example, one vehicle-mounted control unit 400 may include one interface circuit 200 and another common interface; may include a plurality of interface circuits 200 and another common interface; or may include only one or more interface circuits 200.

It should be understood that a plurality of interfaces in one vehicle-mounted control unit 400 may have no dependency relationship, or may cooperate with each other.

It should be further understood that one vehicle-mounted control unit 400 includes at least one controller, for example, an MCU. It should be understood that one MCU may control one or more interfaces.

An embodiment of this application further provides a vehicle, including one or more vehicle-mounted control units 400. The vehicle-mounted control unit 400 may manage and control a vehicle-mounted device in the vehicle. It should be understood that the vehicle may be an electric vehicle, for example, a pure electric vehicle, an extended-range electric vehicle, a hybrid electric vehicle, a fuel cell vehicle, or a new energy vehicle. This is not specifically limited in this application.

An embodiment of this application further provides a control method for an interface circuit. The control method may be combined with any apparatus shown in FIG. 2 to FIG. 11. This is not specifically limited in this embodiment of this application.

The control method includes: A controller 240 controls to configure the interface circuit 200 as one or more of the following interfaces: an H-bridge output interface, a 12 V power output interface, a 5 V digital signal output interface, a 5 V digital signal input interface, a 12 V digital signal input interface, a LIN bus interface, and/or a SENT bus interface.

Optionally, an H-bridge circuit 210 may be a full-bridge circuit or may include two half-bridge circuits. An output end 212 of the H-bridge circuit 210 includes a first output end and a second output end. An interface port IO includes a first interface port $IO_A$ and a second interface port $IO_B$. The first interface port $IO_A$ is connected to the first output end, and the second interface port $IO_B$ is connected to the second output end.

Optionally, an input branch 220 may include a first input branch and a second input branch. The first input branch and the second input branch are connected to the first interface port $IO_A$ and the second interface port $IO_B$ respectively.

Optionally, a LIN bus pull-up resistor branch 231 of a LIN bus may include a first LIN bus pull-up resistor branch and a second LIN bus pull-up resistor branch that are connected in parallel. A LIN bus pull-up resistor 2311 includes a first pull-up resistor R1 and a second pull-up resistor R2. A diode 2312 disposed on the LIN bus pull-up resistor branch includes a first diode D1 and a second diode D2. A first switch component 2313 disposed on the LIN bus pull-up resistor branch includes a third switch component S1 and a fourth switch component S2. The first LIN bus pull-up resistor branch includes the first pull-up resistor R1, the first diode D1, and the third switch component S1. A first end of the first pull-up resistor R1 is connected to a LIN bus power supply 233, a second end of the first pull-up resistor R1 is connected to an anode of the diode D1, and a cathode of the diode D1 is connected to the first interface port $IO_A$ by using the third switch component S1. The second LIN bus pull-up resistor branch includes the second pull-up resistor R2, the second diode D2, and the fourth switch component S2. A first end of the second pull-up resistor R2 is connected to the LIN bus power supply 233, a second end of second pull-up resistor R2 is connected to an anode of the diode D2, and a cathode of the diode D2 is connected to the second interface port $IO_B$ by using the first switch component S2. A first control branch 235 may include a third control branch K1 and a fourth control branch K2. A controller 240 controls on-off of the third switch component S1 and the fourth switch component S2 by using the third control branch K1 and the fourth control branch K2 respectively.

Optionally, a SENT pull-up resistor branch 232 of a SENT bus may include a first SENT bus pull-up resistor branch and a second SENT bus pull-up resistor branch that are connected in parallel A SENT bus pull-up resistor 2321 includes a third pull-up resistor R3 and a fourth pull-up resistor R4. A second switch component 2322 disposed on the SENT bus pull-up resistor branch 232 includes a fifth switch component S3 and a sixth switch component S4. The first SENT bus pull-up resistor branch includes the third pull-up resistor R3 and the fifth switch component S3. A first end of the third pull-up resistor R3 is connected to the SENT bus power supply 234, and a second end of the third pull-up resistor R3 is connected to the first interface port $IO_A$ by using the fifth switch component S3. The second SENT bus pull-up resistor branch includes the fourth pull-up resistor R4 and the sixth switch component S4. A first end of the fourth pull-up resistor R4 is connected to the SENT bus power supply 234, and a second end of the fourth pull-up resistor R4 is connected to the second interface port $IO_B$ by using the sixth switch component S4. A second control branch 236 may include a fifth control branch K3 and a sixth control branch K4. A controller 240 controls on-off of the fifth switch component S3 and the sixth switch component S4 by using the fifth control branch K3 and the sixth control branch K4 respectively.

Optionally, when the interface circuit is configured as the H-bridge output interface, the controller 240 controls the interface circuit to output a control signal of a direct-current brush motor in the H-bridge circuit 210.

Optionally, when the interface circuit is configured as the 12 V power output interface, the controller controls the interface circuit to output a high-side output in the H-bridge circuit 210.

Optionally, when the interface circuit is configured as the 5 V digital signal output interface, the controller 240 controls the interface circuit to output a low-side output in the H-bridge circuit 210.

Optionally, the H-bridge circuit 210 may be an H-bridge circuit with a high-impedance output.

It should be understood that, when the interface circuit is configured as the 5 V digital signal input interface, the controller 240 controls the interface circuit to output a high-impedance output in the H-bridge circuit 210, and collects a signal of the interface port IO by using the input branch 220.

It should be understood that, when the interface circuit is configured as the 12 V digital signal input interface, the controller 240 controls the interface circuit to output a high-impedance output in the H-bridge circuit 210, and collect a signal of the interface port IO by using the input branch 220.

It should be understood that, when the interface circuit is configured as the LIN bus interface, the controller 240 controls to turn on the first switch component 2313, and controls the H-bridge circuit 210 to output a low-side output based on LIN bus timing, or output a high-impedance output based on LIN bus timing.

It should be understood that, when the interface circuit is configured as the SENT bus interface, the controller 240 controls to turn on the second switch component 2322, and controls the H-bridge circuit 210 to output a high-impedance output based on SENT bus timing.

It should be understood that, when the interface circuit is configured as the two output ends cooperating with each other to work, the controller 240 may control the interface circuit to generate, a power supply voltage for a vehicle-mounted electronic device at the first output end of the H-bridge circuit 210, and controls the interface circuit to perform communication at the second output end through the following interface: a LIN bus interface, a SENT bus interface, a 12 V power output interface, a 5 V digital signal input interface, a 5 V digital signal output interface, and a 12 V digital signal input interface.

Optionally, a power supply of the H-bridge circuit 210 may be 12 V, the LIN bus power supply may be 12 V, and the SENT bus power supply may be 5 V. It should be further understood that the H-bridge circuit 210 and the LIN bus share one power supply.

Optionally, the controller may be a micro control unit (MCU).

It should be understood that the specific examples in the embodiments of this application are merely used to help a person skilled in the art to better understand the embodiments of this application, but are not used to limit the scope of the embodiments of this application.

It should be understood that the terms used in the embodiments of this application and the appended claims are merely used for describing specific embodiments, and are not intended to limit the embodiments of this application. For example, the terms "a", "the above" and "the" of singular forms used in the embodiments and the appended claims of this application are also intended to include plural forms, unless otherwise specified in the context clearly.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

In the several embodiments provided in this application, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (a personal computer, a server, or a network device) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An interface circuit of a vehicle-mounted control unit, wherein the interface circuit comprises: an H-bridge circuit, an input branch, wherein
an input end of the H-bridge circuit is connected to a controller, and an output end of the H-bridge circuit is connected to an interface port IO of the interface circuit;
a first end of the input branch is connected to the interface port IO, and a second end of the input branch is connected to the controller, and
the interface circuit is configured as one or more of the following interfaces under the control of the controller: an H-bridge output interface, a 12 V power output interface, a 5 V digital signal output interface, a 5 V digital signal input interface, a 12 V digital signal input interface, a local interconnect network (LIN) bus interface, or a single edge nibble transmission (SENT) bus interface.

2. The interface circuit according to claim 1, wherein the interface circuit further comprises: a pull-up network, wherein
the pull-up network comprises a LIN bus pull-up resistor branch, the LIN bus pull-up resistor branch is provided with a LIN bus pull-up resistor, a diode, and a first switch component, wherein a first end of the LIN bus pull-up resistor is connected to a LIN bus power supply, a second end of the LIN bus pull-up resistor is connected to an anode of the diode, and a cathode of the diode is connected to the interface port IO by using the first switch component; and
on-off of the first switch component is controlled by the controller by using a first control branch.

3. The interface circuit according to claim 1, wherein the interface circuit further comprises: a pull-up network, wherein
the pull-up network comprises a SENT bus pull-up resistor branch, the SENT bus pull-up resistor branch is provided with a SENT bus pull-up resistor and a second switch component, wherein a first end of the SENT bus pull-up resistor is connected to a SENT bus power supply, and a second end of the SENT bus pull-up resistor is connected to the interface port IO by using the second switch component; and
on-off of the second switch component is controlled by the controller by using a second control branch.

4. The interface circuit according to claim 2, wherein the H-bridge circuit is a full-bridge circuit or comprises two half-bridge circuits;
the output end of the H-bridge circuit comprises a first output end and a second output end, and the interface port IO comprises a first interface port and a second interface port; and
the first interface port is connected to the first output end, and the second interface port is connected to the second output end;
wherein the input branch comprises a first input branch and a second input branch, and the first input branch and the second input branch are connected to the first interface port and the second interface port respectively.

5. The interface circuit according to claim 3, wherein the H-bridge circuit is a full-bridge circuit or comprises two half-bridge circuits;
the output end of the H-bridge circuit comprises a first output end and a second output end, and the interface port IO comprises a first interface port and a second interface port; and
the first interface port is connected to the first output end, and the second interface port is connected to the second output end;
wherein the input branch comprises a first input branch and a second input branch, and the first input branch and the second input branch are connected to the first interface port and the second interface port respectively.

6. The interface circuit according to claim 4, wherein the LIN bus pull-up resistor branch comprises a first LIN bus pull-up resistor branch and a second LIN bus pull-up resistor branch that are connected in parallel, the LIN bus pull-up resistor comprises a first pull-up resistor R1 and a second pull-up resistor R2, the diode disposed on the LIN bus pull-up resistor branch comprises a first diode D1 and a second diode D2, and the first switch component disposed on the LIN bus pull-up resistor branch comprises a third switch component S1 and a fourth switch component S2;
the first LIN bus pull-up resistor branch comprises the first pull-up resistor R1, the first diode D1, and the third switch component S1, wherein a first end of the first resistor R1 is connected to the LIN bus power supply, a second end of the first pull-up resistor R1 is connected to an anode of the first diode D1, and a cathode of the first diode D1 is connected to the first interface port by using the third switch component S1;
the second LIN bus pull-up resistor branch comprises the second pull-up resistor R2, the second diode D2, and the fourth switch component S2, wherein a first end of the second pull-up resistor R2 is connected to the LIN bus power supply, a second end of the second pull-up resistor R2 is connected to an anode of the second diode D2, and a cathode of the second diode D2 is connected to the second interface port by using the fourth switch component S2; and
the first control branch comprises a third control branch K1 and a fourth control branch K2, and the controller controls on-off of the third switch component S1 and the fourth switch component S2 by using the third control branch K1 and the fourth control branch K2 respectively.

7. The interface circuit according to claim 5, wherein the SENT bus pull-up resistor branch comprises a first SENT bus pull-up resistor branch and a second SENT bus pull-up resistor branch that are connected in parallel, the SENT bus pull-up resistor comprises a third pull-up resistor R3 and a fourth pull-up resistor R4, and the second switch component disposed on the SENT bus pull-up resistor branch comprises a fifth switch component S3 and a sixth switch component S4;
the first SENT bus pull-up resistor branch comprises the third pull-up resistor R3 and the fifth switch component S3, wherein a first end of the third pull-up resistor R3 is connected to the SENT bus power supply, and a second end of the third pull-up resistor R3 is connected to the first interface port by using the fifth switch component S3;
the second SENT bus pull-up resistor branch comprises the fourth pull-up resistor R4 and the sixth switch component S4, wherein a first end of the fourth pull-up resistor R4 is connected to the SENT bus power supply, and a second end of the fourth pull-up resistor R4 is connected to the second interface port by using the sixth switch component S4; and the second control branch comprises a fifth control branch K3 and a sixth control branch K4, and the controller controls on-off of the fifth switch component S3 and the sixth switch component S4 by using the fifth control branch K3 and the sixth control branch K4 respectively.

8. The interface circuit according to claim 1, wherein when the interface circuit is configured as the H-bridge output interface, the interface circuit is controlled by the controller to output a control signal of a direct-current brush motor in the H-bridge circuit.

9. The interface circuit according to claim 1, wherein when the interface circuit is configured as the 12 V power output interface, the interface circuit is controlled by the controller to output a high-side output in the H-bridge circuit.

10. The interface circuit according to claim 1, wherein when the interface circuit is configured as the 5 V digital signal output interface, the interface circuit is controlled by the controller to output a low-side output in the H-bridge circuit.

11. The interface circuit according to claim 1, wherein the H-Bridge circuit is an H-bridge circuit with a high-impedance output.

12. The interface circuit according to claim 11, wherein when the interface circuit is configured as the 5 V digital signal input interface, the interface circuit is controlled by the controller to output a high-impedance output in the H-bridge circuit and collect a signal of the interface port IO by using the input branch.

13. The interface circuit according to claim 11, wherein when the interface circuit is configured as the 12 V digital signal input interface, the interface circuit is controlled by the controller to output a high-impedance output in the H-bridge circuit and collect a signal of the interface port IO by using the input branch.

14. The interface circuit according to claim 13, wherein when the interface circuit is configured as the 12 V digital signal input interface, the interface circuit is controlled by the controller to output a high-impedance output in the H-bridge circuit and collect a signal of the interface port IO by using the input branch.

15. The interface circuit according to claim 11, wherein when the interface circuit is configured as the LIN bus interface, the interface circuit is controlled by the controller to turn on a first switch component, and the H-bridge circuit is controlled to output a low-side output based on LIN bus timing or output a high-impedance output based on LIN bus timing.

16. The interface circuit according to claim 10, wherein when the interface circuit is configured as the SENT bus interface, the interface circuit is controlled by the controller to turn on a second switch component, and the H-bridge circuit is controlled to output a high-impedance output based on SENT bus timing.

17. The interface circuit according to claim 4, wherein when the interface circuit is configured as the first output end and the second output end cooperating with each other to work, the interface circuit is controlled by the controller to generate a power supply voltage for a vehicle-mounted electronic device at the first output end of the H-bridge circuit and perform communication at the second output end through at least one of the following interface:

a LIN bus interface, a SENT bus interface, a 12 V power output interface, a 5 V digital signal input interface, a 5 V digital signal output interface, or a 12 V digital signal input interface.

18. The interface circuit according to claim 5, wherein when the interface circuit is configured as the first output end and the second output end cooperating with each other to work, the interface circuit is controlled by the controller to generate a power supply voltage for a vehicle-mounted electronic device at the first output end of the H-bridge circuit and perform communication at the second output end through at least one of the following interface:

a LIN bus interface, a SENT bus interface, a 12 V power output interface, a 5 V digital signal input interface, a 5 V digital signal output interface, or a 12 V digital signal input interface.

19. A control method for an interface circuit, wherein the interface circuit comprises: an H-bridge circuit, an input branch wherein an input end of the H-bridge circuit is connected to a controller, and an output end of the H-bridge circuit is connected to an interface port IO of the interface circuit;

a first end of the input branch is connected to the interface port IO, and a second end of the input branch is connected to the controller; and the control method comprises:

controlling, by the controller, the interface circuit to be configured as one or more of the following interfaces: an H-bridge output interface, a 12 V power output interface, a 5 V digital signal output interface, a 5 V digital signal input interface, a 12 V digital signal input interface, a local interconnect network (LIN) interface, or a single edge nibble transmission (SENT) bus interface.

20. The interface circuit according to claim 18, wherein the interface circuit further comprises: a pull-up network, wherein the pull-up network comprises a LIN bus pull-up resistor branch, the LIN bus pull-up resistor branch is provided with a LIN bus pull-up resistor, a diode, and a first switch component, wherein a first end of the LIN bus pull-up resistor is connected to a LIN bus power supply, a second end of the LIN bus pull-up resistor is connected to an anode of the diode, and a cathode of the diode is connected to the interface port IO by using the first switch component; and on-off of the first switch component is controlled by the controller by using a first control branch.

* * * * *

UNITED STATES PATENT AND TRADEMARK OFFICE
CERTIFICATE OF CORRECTION

| | |
|---|---|
| PATENT NO. | : 12,009,768 B2 |
| APPLICATION NO. | : 17/863654 |
| DATED | : June 11, 2024 |
| INVENTOR(S) | : Zixu Wu |

It is certified that error appears in the above-identified patent and that said Letters Patent is hereby corrected as shown below:

In the Claims

In Column 25, In Line 17 (Approx.), In Claim 1, delete "controller," and insert -- controller; --.

In Column 26, In Line 28, In Claim 6, after "the first" insert -- pull-up --.

Signed and Sealed this
Twenty-ninth Day of October, 2024

Katherine Kelly Vidal
*Director of the United States Patent and Trademark Office*